US012765422B2

(12) United States Patent
Chen et al.

(10) Patent No.: US 12,765,422 B2
(45) Date of Patent: Oct. 13, 2026

(54) LIGHT-EMITTING SUBSTRATE AND DISPLAY DEVICE

(71) Applicants: BOE MLED Technology Co., Ltd., Beijing (CN); BOE Technology Group Co., Ltd., Beijing (CN)

(72) Inventors: Ying Chen, Beijing (CN); Yutao Hao, Beijing (CN); Donglei Li, Beijing (CN); Lili Jia, Beijing (CN); Jingran Niu, Beijing (CN); Pei Qin, Beijing (CN); Honghao Yu, Beijing (CN); Jiaxin Li, Beijing (CN); Jie Gao, Beijing (CN); Xueqiao Li, Beijing (CN); Shanwei Yang, Beijing (CN)

(73) Assignees: BOE MLED Technology Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 497 days.

(21) Appl. No.: 18/275,575

(22) PCT Filed: May 26, 2022

(86) PCT No.: PCT/CN2022/095248

§ 371 (c)(1),
(2) Date: Aug. 2, 2023

(87) PCT Pub. No.: WO2023/225944

PCT Pub. Date: Nov. 30, 2023

(65) Prior Publication Data

US 2025/0015056 A1 Jan. 9, 2025

(51) Int. Cl.
*H10W 90/00* (2026.01)
*G02F 1/13357* (2006.01)
(Continued)

(52) U.S. Cl.
CPC .......... *H10W 90/00* (2026.01); *H10H 20/857* (2025.01); *H10H 20/856* (2025.01)

(58) Field of Classification Search
CPC ............... H10H 20/856; H10H 20/857; H10H 20/0364; H05K 2201/10106; G02F 1/133603
See application file for complete search history.

(56) References Cited

U.S. PATENT DOCUMENTS

2004/0222433 A1 11/2004 Numajiri et al.
2013/0320371 A1 12/2013 Sugizaki et al.
(Continued)

FOREIGN PATENT DOCUMENTS

CN 204335155 U 5/2015
CN 207573710 U 7/2018
(Continued)

OTHER PUBLICATIONS

May 19, 2026—(JP) First Office Action Appn 2024-555421 with English translation.
Jun. 18, 2026—(IN) First Examination Report Appn 202447069029 with English translation.

*Primary Examiner* — Antonio B Crite
(74) *Attorney, Agent, or Firm* — Banner & Witcoff, Ltd.

(57) ABSTRACT

A light-emitting substrate and a display device are provided. The light-emitting substrate includes a base substrate, a reflective layer, at least one pad, a light-emitting element and a connecting portion. The reflective layer includes an opening with a maximum size H1 in a first direction; the light-emitting element includes a first electrode and a second electrode arranged at intervals in a second direction, and a maximum size of the first electrode or the second electrode in the first direction is a first size K1; the connecting portion includes an edge radian region with a maximum size M in the first direction; the at least one pad includes a first pad, the
(Continued)

first pad includes a first size portion, a minimum distance between the first size portion and the opening in the first direction is a second size K2 which satisfies: K2≤0.5H1−0.5(K1+2M), and 50 μm≤H1−2K2−K1≤100 μm.

20 Claims, 11 Drawing Sheets

(51) Int. Cl.

| | |
|---|---|
| ***H05K 1/11*** | (2006.01) |
| ***H05K 3/341*** | (2026.01) |
| ***H10H 20/01*** | (2025.01) |
| ***H10H 20/831*** | (2025.01) |
| ***H10H 20/857*** | (2025.01) |
| *H10H 20/856* | (2025.01) |

(56) References Cited

U.S. PATENT DOCUMENTS

| | | | | |
|---|---|---|---|---|
| 2020/0271979 | A1 | 8/2020 | Roh | |
| 2020/0403133 | A1* | 12/2020 | Yoo .................... | H10H 20/8582 |
| 2021/0376043 | A1 | 12/2021 | Kang et al. | |

FOREIGN PATENT DOCUMENTS

| | | | |
|---|---|---|---|
| CN | 111599837 | A | 8/2020 |
| CN | 110323324 | B | 6/2021 |
| CN | 113764473 | A | 12/2021 |
| CN | 113889558 | A | 1/2022 |
| JP | 2003234567 | A | 8/2003 |
| KR | 20190017691 | A | 2/2019 |
| WO | 2020096150 | A1 | 5/2020 |
| WO | 2022019188 | A1 | 1/2022 |

* cited by examiner

LIGHT-EMITTING SUBSTRATE AND DISPLAY DEVICE

TECHNICAL FIELD

At least one embodiment of the present disclosure relates to a light-emitting substrate and a display device.

BACKGROUND

At present, micro light-emitting diode display (Micro LED Display) technology is becoming increasingly mature with characteristics such as low energy consumption, high brightness and the like, and hence possesses a high development prospect.

SUMMARY

At least one embodiment of the present disclosure provides a light-emitting substrate and a display device.

The embodiment of the present disclosure provides a light-emitting substrate, including: a base substrate; a reflective layer, arranged on the base substrate, wherein the reflective layer includes an opening, and a maximum size of the opening in a first direction is H1; at least one pad, wherein an orthographic projection of the at least one pad on the base substrate at least partially overlaps with an orthographic projection of the opening on the base substrate; a light-emitting element, arranged on the base substrate, wherein an orthographic projection of the light-emitting element on the base substrate at least partially overlaps with the orthographic projection of the opening on the base substrate, and the light-emitting element includes a first electrode and a second electrode; and a connecting portion, arranged between the at least one pad and the light-emitting element, and configured to connect the at least one pad and the light-emitting element, wherein the connecting portion includes an edge radian region, and a maximum size of the edge radian region in the first direction is M; wherein the first electrode and the second electrode are arranged at intervals in a second direction, the second direction intersects with the first direction, and a maximum size of the first electrode or the second electrode in the first direction is a first size K1; and the at least one pad includes a first pad, the first pad includes a first size portion, a minimum distance between the first size portion and the opening in the first direction is a second size K2, and the second size K2 satisfies: $K2 \leq 0.5H1-0.5(K1+2M)$, and $50\ \mu m \leq H1-2K2-K1 \leq 100\ \mu m$.

For example, according to the embodiment of the present disclosure, the first pad further includes a second size portion, a maximum distance between the second size portion and the opening in the first direction is a third size H2, and the third size H2 satisfies: $0.5H1-0.6K1 \leq H2 \leq 0.5H1-0.4K1$.

For example, according to the embodiment of the present disclosure, the at least one pad further includes a second pad, the first pad and the second pad are distributed at intervals and are symmetrical relative to a first centerline located between the first pad and the second pad; the first electrode and the second electrode are symmetrically distributed relative to a second centerline located between the first electrode and the second electrode of the light-emitting element; wherein the at least one pad is arranged at a side of the first electrode and the second electrode close to the base substrate; a minimum distance between the first electrode and the second electrode in the second direction is a fourth size Z; and a minimum distance between the first pad and the second pad in the second direction is a fifth size D, wherein $0.9Z \leq D \leq Z$.

For example, according to the embodiment of the present disclosure, a minimum distance between the first size portion and the first centerline in the second direction is a sixth size C1, and a minimum distance between the second size portion and the first centerline in the second direction is a seventh size C2; and a maximum distance between the first electrode and the second centerline in the second direction is an eighth size Y, wherein $Y=MAX(C1, C2)$.

For example, according to the embodiment of the present disclosure, in the second direction, a maximum distance between an edge of the first pad away from the second pad and an edge of the second pad away from the first pad is equal to a maximum size of the opening; and the first size portion and the second size portion each include a first end and a second end opposite to each other, wherein the first end of the first size portion is closer to the first centerline than the second end of the first size portion, and the first end of the second size portion is closer to the first centerline than the second end of the second size portion.

For example, according to the embodiment of the present disclosure, in the first direction, a minimum distance between the first end of the first size portion and the opening is a second size K2, and a maximum distance between the first end of the second size portion and the opening is a third size H2.

For example, according to the embodiment of the present disclosure, an orthographic projection of the first size portion on the base substrate is a rectangle, a size of the first size portion in the first direction is greater than a size of the first size portion in the second direction, and an orthographic projection of the second end of the first size portion on the base substrate overlaps with the orthographic projection of the opening on the base substrate; an orthographic projection of the second size portion on the base substrate is a trapezoid, and the second size portion includes an upper bottom and a lower bottom parallel to the first centerline, a distance between the upper bottom and the opening in the first direction is greater than a distance between the lower bottom and the opening in the first direction.

For example, according to the embodiment of the present disclosure, an orthographic projection of the first size portion on the base substrate is a rectangle, and a size of the first size portion in the first direction is greater than a size of the first size portion in the second direction; an orthographic projection of the second size portion on the base substrate is a rectangle, and a size of the second size portion in the first direction is greater than a size of the second size portion in the second direction; the first pad further includes a third size portion, the third size portion includes a first end and a second end opposite to each other, and the first end of the third size portion is connected with the second end of the first size portion in the second direction, an orthographic projection of the second end of the third size portion on the base substrate overlaps with the orthographic projection of the opening on the base substrate, and a size of the third size portion in the second direction is smaller than the size of the first size portion in the second direction.

For example, according to the embodiment of the present disclosure, the size of the second size portion in the first direction gradually increases from the first end of the second size portion to the second end of the second size portion, and a size of the second end of the second size portion in the first direction is equal to a size of the first end of the first size portion in the first direction.

For example, according to the embodiment of the present disclosure, in the first direction, a minimum distance between the first end of the first size portion and the opening is the second size K2, a maximum distance between the first end of the second size portion and the opening is the third size H2, and an orthographic projection of the second end of the second size portion on the base substrate overlaps with the orthographic projection of the opening on the base substrate.

For example, according to the embodiment of the present disclosure, an orthographic projection of the first size portion on the base substrate is a rectangle, and a size of the first size portion in the first direction is greater than a size of the first size portion in the second direction; an orthographic projection of the second size portion on the base substrate is a rectangle, and a size of the second size portion in the first direction is smaller than the size of the first size portion in the second direction; the second end of the first size portion is connected with the first end of the second size portion.

For example, according to the embodiment of the present disclosure, the first pad further includes a third size portion, the third size portion includes a first end and a second end opposite to each other, and the first end of the third size portion is connected with the second end of the first size portion in the second direction, and the second end of the third size portion is connected with the first end of the second size portion; a size of the third size portion in the first direction gradually decreases from the first end of the third size portion to the second end of the third size portion, a size of the first end of the third size portion in the first direction is equal to a size of the second end of the first size portion in the first direction, and a size of the second end of the third size portion in the first direction is equal to a size of the first end of the second size portion in the first direction.

For example, according to the embodiment of the present disclosure, an orthographic projection of the third size portion on the base substrate is a trapezoid.

For example, according to the embodiment of the present disclosure, in the first direction, a size of the second end of the first size portion is equal to a size of the first end of the second size portion, and the second end of the first size portion is connected with the first end of the second size portion; a size of the first size portion in the first direction gradually decreases from the first end of the first size portion to the second end of the second size portion; the first pad further includes a third size portion, the third size portion includes a first end and a second end opposite to each other, and the second end of the third size portion is in matched connection with the first end of the first size portion in the second direction; a size of the third size portion in the first direction gradually decreases from the first end of the third size portion to the second end of the third size portion.

For example, according to the embodiment of the present disclosure, an orthographic projection of the first size portion on the base substrate is a trapezoid, and an orthographic projection of the third size portion on the base substrate is a trapezoid.

For example, according to the embodiment of the present disclosure, a connecting side portion between the second end of the first size portion and the first end of the second size portion is arc-shaped; and the first end of the third size portion is arc-shaped.

For example, according to the embodiment of the present disclosure, in the first direction, a minimum distance between the first end of the first size portion and the opening is the second size K2, a maximum distance between the first end of the second size portion and the opening is the third size H2, and the second end of the first size portion is connected with the first end of the second size portion; the first pad further includes a third size portion and a fourth size portion, the third size portion and the fourth size portion each include a first end and a second end opposite to each other; the first end of the third size portion is connected with the second end of the second size portion in the second direction, an orthographic projection of the second end of the third size portion on the base substrate overlaps with the orthographic projection of the opening on the base substrate, and the second end of the fourth size portion is connected with the first end of the first size portion; a size of the third size portion in the first direction gradually decreases from the first end of the third size portion to the second end of the third size portion; a size of the fourth size portion in the first direction gradually decreases from the first end of the fourth size portion to the second end of the fourth size portion, and a size of the second end of the fourth size portion in the first direction is equal to a size of the first end of the first size portion in the first direction.

For example, according to the embodiment of the present disclosure, an orthographic projection of each of the first size portion, the second size portion, the third size portion, and the fourth size portion on the base substrate is a trapezoid.

For example, according to the embodiment of the present disclosure, in the first direction, a maximum size of the first size portion is equal to the maximum size of the opening; the first size portion and the second size portion each include a first end and a second end opposite to each other, and the first end of the first size portion and the first end of the second size portion are arranged at a side close to the first centerline; and a minimum distance between the second end of the first size portion and the opening in the second direction is substantially equal to a size of the first size portion in the second direction.

For example, according to the embodiment of the present disclosure, a size of the first size portion in the first direction is greater than a size of the first size portion in the second direction; and a size of the second size portion in the second direction gradually increases from the first end of the second size portion to the second end of the second size portion.

For example, according to the embodiment of the present disclosure, an orthographic projection of the first size portion on the base substrate is a rectangle, and an orthographic projection of the second size portion on the base substrate is a trapezoid.

The embodiment of the present disclosure provides a light-emitting substrate, including: a base substrate; a reflective layer, arranged on the base substrate, wherein the reflective layer includes an opening; at least one pad, wherein an orthographic projection of the at least one pad on the base substrate at least partially overlaps with an orthographic projection of the opening on the base substrate, the at least one pad includes a first pad and a second pad, and the first pad and the second pad are distributed symmetrically relative to a first centerline located between the first pad and the second pad; a light-emitting element, arranged on the base substrate, wherein an orthographic projection of the light-emitting element on the base substrate at least partially overlaps with the orthographic projection of the opening on the base substrate, and the light-emitting element includes a first electrode and a second electrode, the first electrode and the second electrode are distributed symmetrically relative to a second centerline located between the first electrode and the second electrode; and a connecting portion, arranged between the at least one pad and the light-emitting element, and configured to connect the at least one pad and the light-emitting element, wherein the first pad is arranged at a side of one of the first electrode and the second electrode close to the base substrate, and the second pad is arranged at a side of the other one of the first electrode and the second electrode away from the base substrate; and a minimum interval between the first electrode and the second electrode in their arrangement direction is a fourth size Z, and a minimum interval between the first pad and the second pad in their arrangement direction is a fifth size D, wherein $0.9Z \leq D \leq Z$.

The embodiment of the present disclosure provides a light-emitting substrate, including: a base substrate; a reflective layer, arranged on the base substrate, wherein the reflective layer includes an opening; at least one pad, wherein an orthographic projection of the at least one pad on the base substrate at least partially overlaps with an orthographic projection of the opening on the base substrate, the at least one pad includes a first pad and a second pad, and the first pad and the second pad are distributed symmetrically relative to a first centerline located between the first pad and the second pad; a light-emitting element, arranged on the base substrate, wherein an orthographic projection of the light-emitting element on the base substrate at least partially overlaps with the orthographic projection of the opening on the base substrate, and the light-emitting element includes a first electrode and a second electrode, and the first electrode and the second electrode are distributed symmetrically relative to a second centerline located between the first electrode and the second electrode; and a connecting portion, arranged between the at least one pad and the light-emitting element, and configured to connect the at least one pad and the light-emitting element, wherein the first pad is arranged at a side of one of the first electrode and the second electrode close to the base substrate, and the second pad is arranged at a side of the other one of the first electrode and the second electrode away from the base substrate; the first pad includes a first size portion and a second size portion, a minimum interval between the first size portion and the first centerline in an arrangement direction of the first pad and the second pad is a sixth size C1, and a minimum distance between the second pad and the first centerline in the arrangement direction of the first pad and the second pad is a seventh size C2; and a maximum distance between the first electrode and the second centerline in an arrangement direction of the first electrode and the second electrode is an eighth size Y, wherein $Y = \mathrm{MAX}(C1, C2)$.

The embodiment of the present disclosure provides a light-emitting substrate, including: a base substrate; a reflective layer, arranged on the base substrate, wherein the reflective layer includes an opening, and a maximum size of the opening in a first direction is H1; at least one pad, wherein an orthographic projection of the at least one pad on the base substrate at least partially overlaps with an orthographic projection of the opening on the base substrate, the at least one pad includes a first pad and a second pad, the first pad and the second pad are distributed at intervals in a second direction, the second direction intersects with the first direction, and the first pad includes a first size portion and a second size portion, wherein a minimum interval between the first size portion and the opening is K2, and a maximum interval between the second size portion and the opening is H2, which satisfies: $H2 = H1/3 \pm 0.2\ \mu m$, $50\ \mu m \leq H1 - 2K2 - (H1 - 2H2)/(1 \pm 0.2) \leq 100\ \mu m$.

The embodiment of the present disclosure provides a display device, including the light-emitting substrate according to any of the above.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

Figure 1:
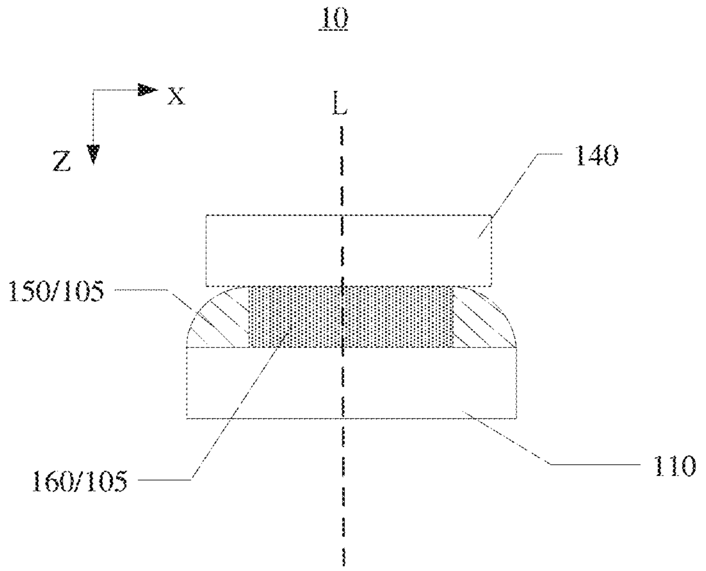
FIG. 1 is a cross-sectional schematic view of a light-emitting substrate.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising." "include," "including." etc., are intended to specify that the elements or the objects stated before these terms encompass the elements or the objects and equivalents thereof listed after these terms, but do not preclude the other elements or objects.

Features such as "vertical", "parallel" and "identical" used in the embodiments of the present disclosure all include features such as "vertical", "parallel" and "identical" in a strict sense, and cases such as "approximately vertical", "approximately parallel" and "approximately identical" containing certain errors, which is intended to be within an acceptable deviation range for a specific value determined by a person skilled in the art, by considering the measurement and the errors related to a specific number of measurements (that is, the limitations of the measurement system). The "center" in the embodiments of the present disclosure may include a geometric center position in strict sense and a roughly central position within a small area around the geometric center. For example, "approximately" may indicate that it's within one or more standard deviations, or within 10% or 5% of the stated value.

With the continuous development of micro light-emitting diode display technology, it has become an inevitable trend to optimize the display effect. In order to improve the performance of a display device, some display products optimize a matching size of a light-emitting element in the light-emitting substrate and also a structure form of a pad in the light-emitting substrate to optimize the line performance and optical effect.

With the continuous development of new-type micro light-emitting diode display (Micro LED Display) technology, light-emitting elements are usually soldered and fixed to a base substrate of a display device by a reflow soldering method with solder.

In a complete soldering process, the solder goes through steps, in sequence, including for example, preheating, heat preservation, reflow soldering, cooling and the like. For example, a preheating phase can avoid component damage due to sharp, high-temperature heating, and solder activity can be enhanced at this stage. A main purpose of the heat preservation phase is to stabilize a temperature of each component in a reflow soldering furnace to minimize a temperature difference as far as possible, and this stage can provide enough time so that a temperature of a larger component in a light-emitting substrate tends to be consistent with a temperature of a smaller component, and a flux in the solder can be fully volatilized. In this way, during a process of reflow soldering, the temperature rises rapidly, the solder reaches a molten state, and then the light-emitting element is bonded to the base substrate. Finally, in a cooling phase, the temperature is reduced below a solid phase temperature to solidify the solder.

For example, the solder described above may be a solder paste, which is a paste made of solder powder, flux and other additives. The solder paste has a certain viscosity at normal temperature, which can initially stick electronic components in predetermined positions. At a soldering temperature, as solvent and part of additives volatilize, the solder paste can solder the components to be soldered together with a printed circuit pad, and form a permanent connection.

Figure 2A:
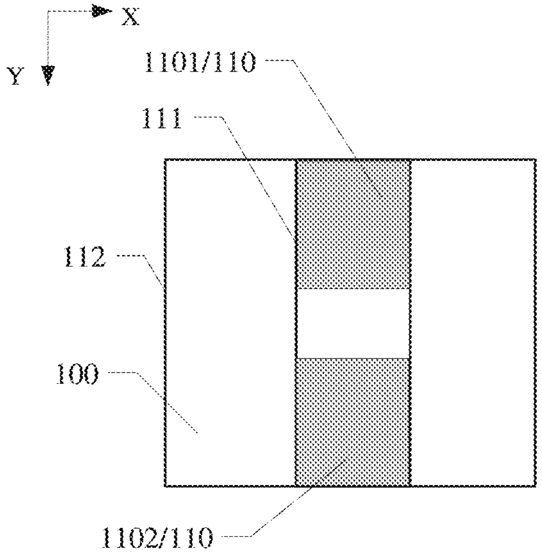
FIG. 2A is a schematic diagram of a pad arrangement in a light-emitting substrate.
Figure 2B:
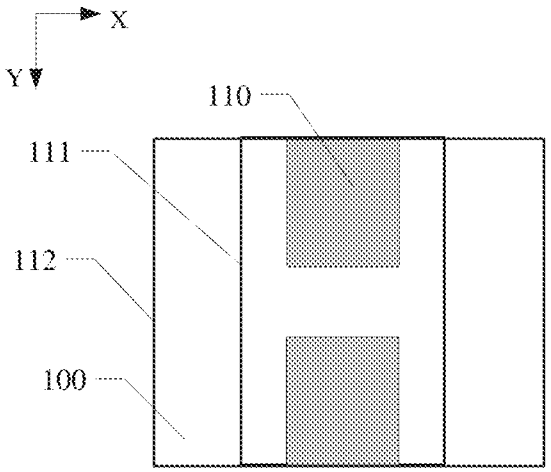
FIG. 2B is a schematic diagram of another pad arrangement in a light-emitting substrate.
Figure 3:
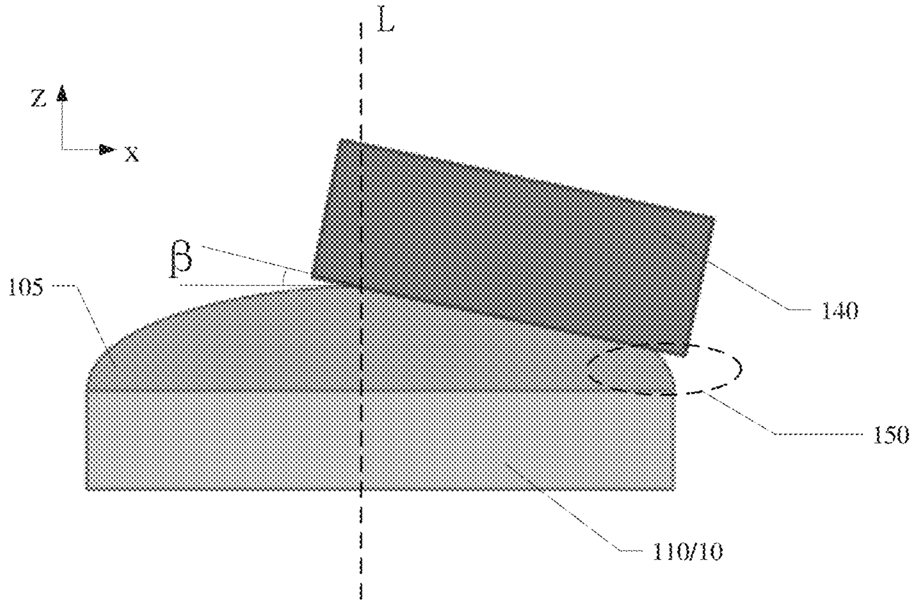
FIG. 3 is a schematic diagram of a light-emitting element with a tilt or deviation in a light-emitting substrate.

FIG. 1 is a cross-sectional schematic view of a light-emitting substrate; FIG. 2A is a schematic diagram of a pad arrangement in a light-emitting substrate; FIG. 2B is a schematic diagram of another pad arrangement in a light-emitting substrate; FIG. 3 is a schematic diagram of a light-emitting element with a tilt or deviation in a light-emitting substrate.

As illustrated in FIG. 1, a light-emitting substrate 10 includes a pad 110, solder 105 and a light-emitting element 140, the light-emitting element 140 is arranged on a side of the solder 105 away from the pad 110.

Referring to FIG. 2A-FIG. 2B, a reflective layer 100 is arranged on one side of the base substrate, the reflective layer 100 includes an opening 111, and the reflective layer 100 is not arranged within the opening 111. The pad 110 is arranged in a region of the opening 111 defined by the reflective layer 100, and an orthographic projection of the pad 110 on the base substrate at least partially overlaps with an orthographic projection of the opening 111 on the base substrate. The pad 110 includes a first pad 1101 and a second pad 1102 which are arranged opposite to each other; for example, the first pad 1101 and the second pad 1102 may correspond to two connecting electrodes in the light-emitting element, respectively, and are electrically connected to the two connecting electrodes, respectively, so as to conduct the two connecting electrodes, respectively, thereby causing the light-emitting element to emit light.

Generally, the pad 110 arranged in the opening 111 requires for a certain processing treatment, for example, a gold-plating-on-copper process is required to enhance a connecting capability between the pad 110 and the connecting electrode.

For example, as an arrangement manner of the pad 110 illustrated in FIG. 2A, the reflective layer 100 has a boundary 112. A maximum size of the opening 111 of the reflective layer 100 in a first direction X is substantially equal to a maximum size of the pad 110 in the first direction X.

An inventor of the present disclosure found that in the case where the arrangement manner of the pad 110 illustrated in FIG. 2A is adopted, because the reflective layer 100 and the pad 110 are arranged in close proximity, during the gold-plating-on-copper process of the pad 110, a part of the metal may penetrate into nearby reflective layer 100 through the opening 111. In the case where too much metal penetrates into the reflective layer 100, the first pad 1101 and the second pad 1102 may be conducted through the part of the metal that penetrates into the reflective layer 100, so that a short circuit and other faults may occur, thereby affecting light-emitting effect of the light-emitting element.

Therefore, an arrangement manner of the pad illustrated in FIG. 2B may be adopted; that is, the maximum size of the opening 111 in the reflective layer 100 in the first direction X is made to be greater than the size of the pad 110 in the first direction X, so that the opening 111 of the reflective layer 100 has a certain interval distance from the pad 110 in the first direction X. In this way, during a processing treatment (for example, a gold-plating-on-copper process) of the pad 110, the metal is difficult to penetrate into the reflective layer 100 through the opening 111, so that the risk of "gold infiltration phenomenon" is reduced.

However, for the arrangement manner of the pad illustrated in FIG. 2B, the size of the opening 111 will considerably affect the performance of the entire light-emitting substrate 10. For example, a too large size of the opening 111 may result in a reduced, overall area of the reflective layer 100, which leads to a weaken reflecting effect of the reflective layer 100 for light and a lowered light-emitting efficiency of the light-emitting substrate 10; while a too small size of the opening 111 may result in that the pad 22 is closer to the reflective layer 100 around it, thereby increasing the risk of "gold infiltration phenomenon".

Further, the inventor of the present disclosure further notes that, as illustrated in FIG. 1, after soldering, the solder 105 usually forms a flat region 160 in a contact portion (for example, an electrode region) soldered with the light-emitting element 140, and in the case where the flat region 160 is symmetrically distributed (or basically symmetrically distributed) relative to a centerline L, the light-emitting element 140 is also symmetrically distributed (or basically symmetrically distributed) relative to the centerline L, at which time the light-emitting element 140 has no deviation. By contrast, in the case where the arrangement manner of the pad illustrated in FIG. 2B is adopted, the light-emitting element 140 is fixed with the pad 110 by means of reflow soldering; and when the solder 105 is melted into a liquid state, due to the absence of the opening 111 of the reflective layer 100 illustrated in FIG. 2A which is used as a boundary to limit a flow state of the solder 105, the solder 105 will form an edge radian region 150 located on both sides of the flat region 160 under an action of tension. Furthermore, in this case, the light-emitting element 140, under an influence of its own gravity, a return wind and other factors, is easy to irregularly deviate towards both sides of the centerline L; and when the light-emitting element 140 deviates to the edge radian region 150 at both sides of the solder 105, a tilting degree of the light-emitting element 140 will be further intensified.

FIG. 3 shows a situation in the case where the light-emitting element 140 has a tilt or deviation as described above, for example, a range of a tilt angle β of the light-emitting element 140 is about 7~12°. Therefore, in the case where a plurality of light-emitting elements 140 on the light-emitting substrate 10 have different tilting degrees at the same time, light-emitting angles of the light-emitting elements 140 will present difference in different degrees, so that light-emitting intensities of the light-emitting elements 140 on the pads 110 are different in a third direction Z perpendicular to the base substrate, which may lead to uneven dark and light on the light-emitting substrate 10 in a backlight state.

Based on this, embodiments of the present disclosure provide a light-emitting substrate, including a base substrate, a reflective layer, at least one pad, a light-emitting element, and a connecting portion. The reflective layer is arranged on the base substrate, and the reflective layer includes an opening, and a maximum size of the opening in a first direction is H1; an orthographic projection of the at least one pad on the base substrate at least partially overlaps with an orthographic projection of the opening on the base substrate; the light-emitting element is arranged on the base substrate, an orthographic projection of the light-emitting element on the base substrate at least partially overlaps with the orthographic projection of the opening on the base substrate, and the light-emitting element includes a first electrode and a second electrode; the connecting portion is arranged between the pad and the light-emitting element and is configured to connect the pad and the light-emitting element, the connecting portion includes an edge radian region, and a maximum size of the edge radian region in the first direction is M; the first electrode and the second electrode are arranged at intervals in a second direction intersecting with the first direction, and a maximum size of the first electrode or the second electrode in the first direction is a first size K1; the at least one pad includes a first pad, the first pad includes a first size portion, a minimum distance between the first size portion and the opening in the first direction is a second size K2, and the second size K2 satisfies: $K2 \leq H1/2-1/2(K1+2M)$, where $50\ \mu m \leq H1-2K2-K1 \leq 100\ \mu m$.

The light-emitting substrate provided by the embodiments of the present disclosure may enable the pad of the light-emitting substrate to have a suitable interval distance from an edge of the opening of the reflective layer in which the pad is located, so as to reduce the "gold infiltration phenomenon", and at the same time to further reduce a risk of tilt of the light-emitting element arranged on the pad, thereby optimizing an optical performance of the light-emitting substrate.

The light-emitting substrate and a display device provided by embodiments of the present disclosure are described below in conjunction with accompanying drawings.

Figure 4:
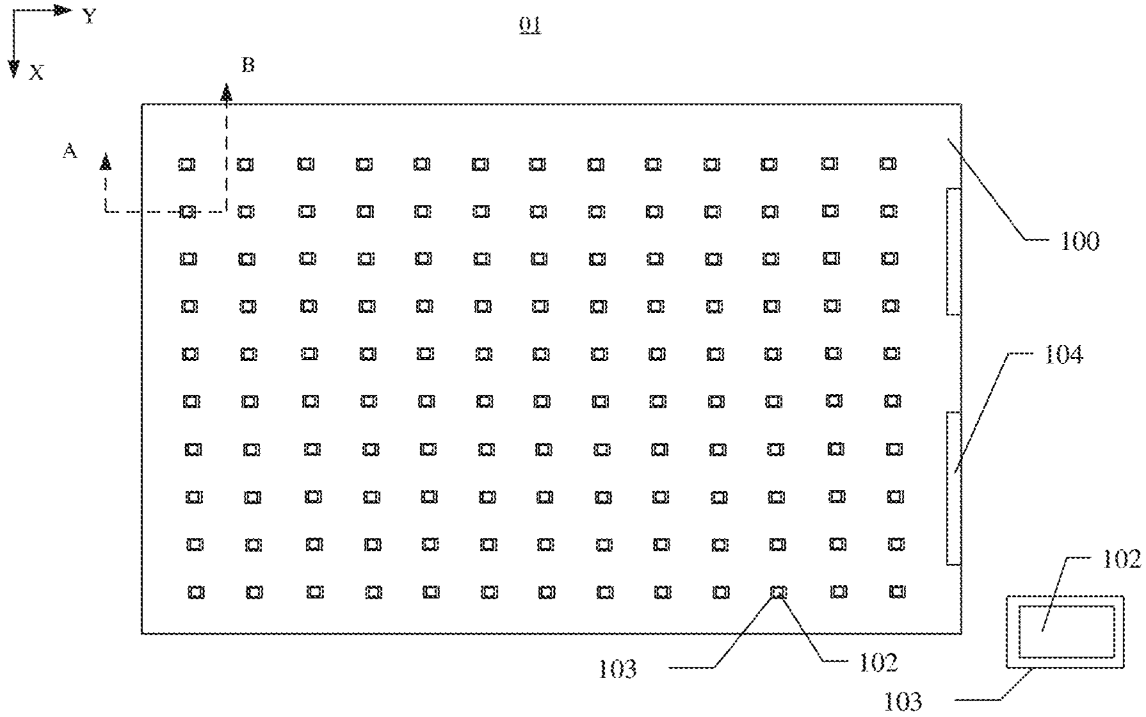
FIG. 4 is a top view of a light-emitting substrate provided by an embodiment of the present disclosure.
Figure 5A:
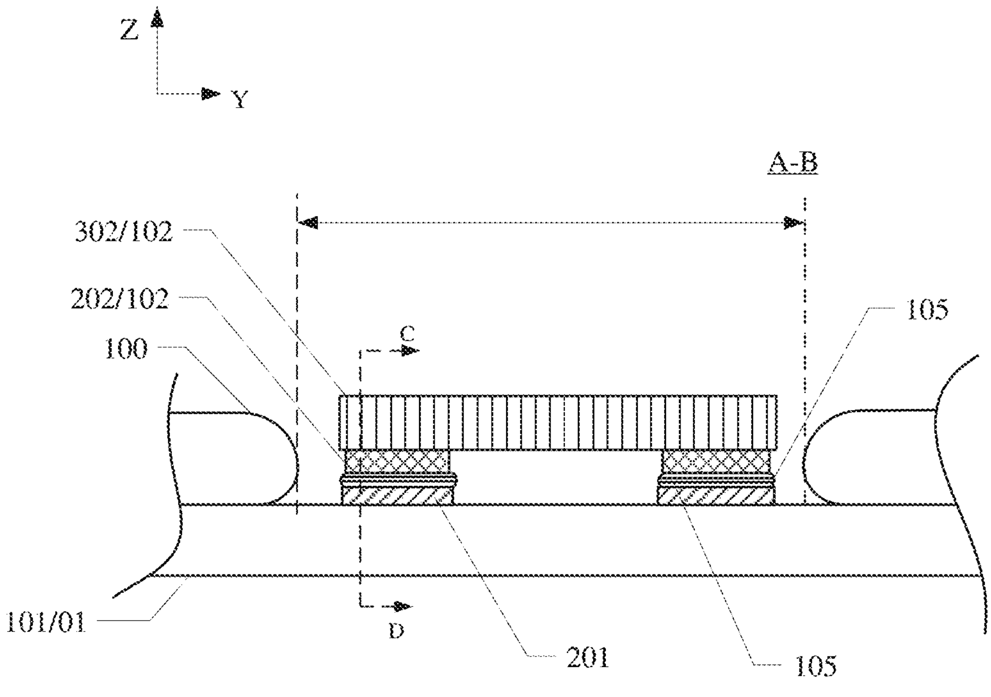
FIG. 5A is a cross-sectional schematic view taken along line A-B of a light-emitting substrate in FIG. 4.
Figure 5B:
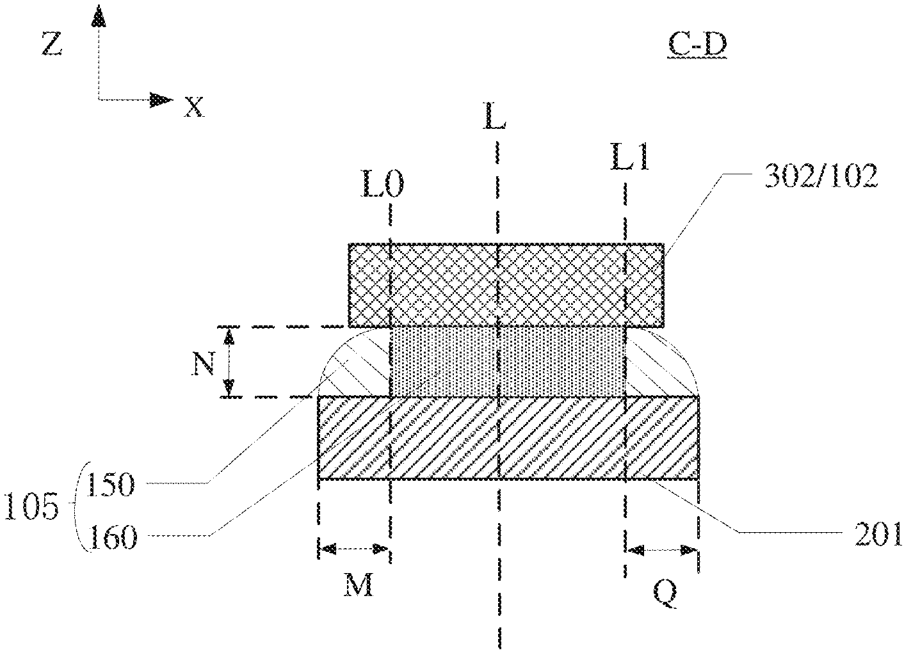
FIG. 5B is a cross-sectional schematic view taken along line C-D of a light-emitting substrate in FIG. 5A.
Figure 5C:
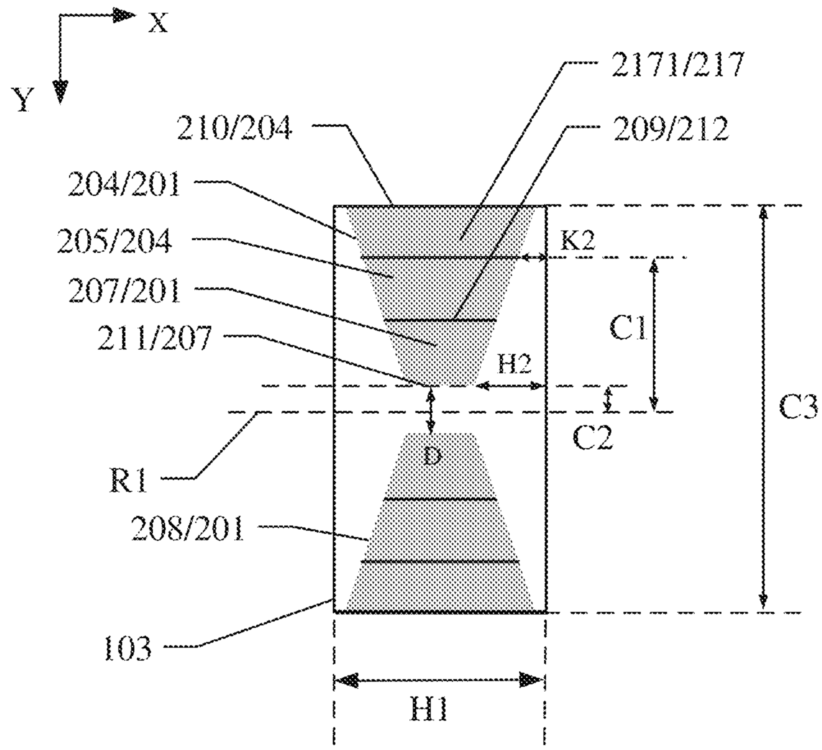
FIG. 5C is a schematic diagram of a pad structure in a light-emitting substrate provided by an embodiment of the present disclosure.
Figure 5D:
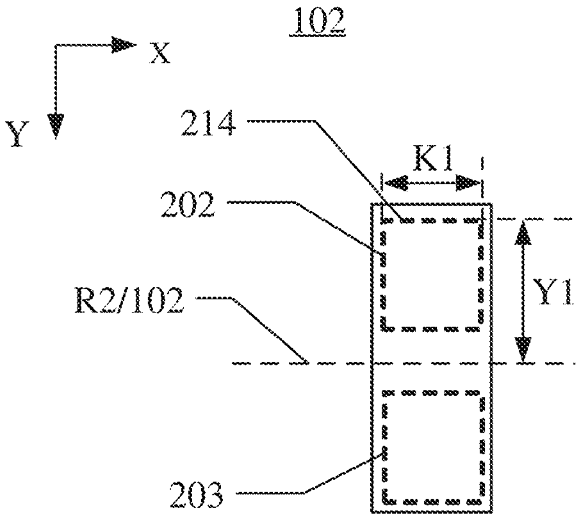
FIG. 5D is a schematic diagram of a light-emitting element in a light-emitting substrate provided by an embodiment of the present disclosure.
Figure 5E:
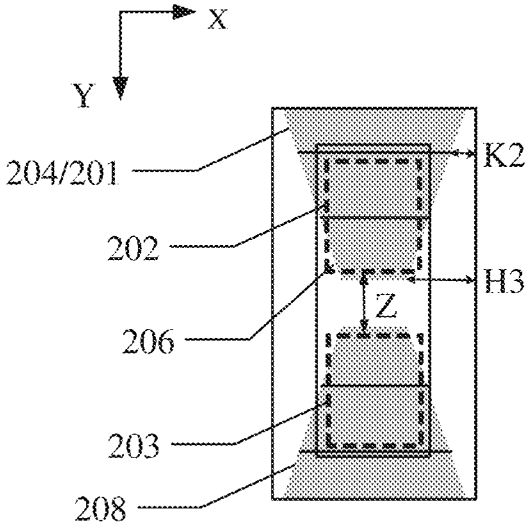
FIG. 5E is a schematic diagram of a light-emitting element arranged in match with a pad in a light-emitting substrate provided by an embodiment of the present disclosure.
Figure 5F:
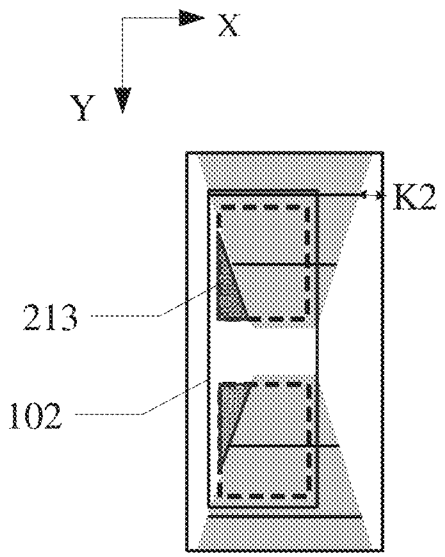
FIG. 5F is a schematic diagram of a light-emitting element with a deviation in a light-emitting substrate provided by an embodiment of the present disclosure.

FIG. 4 is a top view of a light-emitting substrate provided by an embodiment of the present disclosure; FIG. 5A is a cross-sectional schematic view taken along line A-B of a light-emitting substrate in FIG. 4; FIG. 5B is a cross-sectional schematic view taken along line C-D of a light-emitting substrate in FIG. 5A; FIG. 5C is a schematic diagram of a pad structure in a light-emitting substrate provided by an embodiment of the present disclosure; FIG. 5D is a schematic diagram of a light-emitting element in a light-emitting substrate provided by an embodiment of the present disclosure; FIG. 5E is a schematic diagram of a light-emitting element arranged in match with a pad in a light-emitting substrate provided by an embodiment of the present disclosure; and FIG. 5F is a schematic diagram of a light-emitting element with a deviation in a light-emitting substrate provided by an embodiment of the present disclosure.

Referring to FIG. 4-FIG. 5D, an embodiment of the present disclosure provides a light-emitting substrate 01 including a base substrate 101, a reflective layer 100, at least one pad 201, a light-emitting element 102, and a connecting portion 105.

Referring to FIG. 4-FIG. 5C, the reflective layer 100 is arranged on the base substrate 101 and is configured to reflect light incident thereon; the reflective layer 100 includes an opening 103, and a maximum size of the opening 103 in the first direction X is H1; an orthographic projection of the at least one pad 201 on the base substrate 101 at least partially overlaps with an orthographic projection of the opening 103 on the base substrate 101. It should be noted that, in the light-emitting substrate provided in the embodiment of the present disclosure, the reflective layer 100 is not provided in a region defined by the opening 103.

Referring to FIG. 4-FIG. 5D, a light-emitting element 102 is arranged on the base substrate 101, an orthographic projection of the light-emitting element 102 on the base substrate 101 at least partially overlaps with the orthographic projection of the opening 103 on the base substrate 101, and the light-emitting element 102 includes a first electrode 202 and a second electrode 203; the connecting portion 105 is arranged between the pad 201 and the light-emitting element 102 and is configured to connect the pad 201 with the light-emitting element 102; the connecting portion 105 includes an edge radian region 150, and a maximum size of the edge radian region 150 in the first direction X is M.

For example, referring to FIG. 4, FIG. 5D and FIG. 5E, the first electrode 202 and the second electrode 203 are arranged at intervals in a second direction Y intersecting with the first direction X, and a maximum size of the first electrode 202 or the second electrode 203 in the first direction X is a first size K1. The at least one pad 201 includes a first pad 204, the first pad 204 includes a first size portion 205, a minimum distance between the first size portion 205 and the opening 103 in the first direction X is a second size K2, and the second size K2 satisfies: $K2 \leq 0.5H1-0.5(K1+2M)$, where $50\ \mu m \leq H1-2K2-K1 \leq 100\ \mu m$.

For example, the embodiments of the present disclosure is described with reference to the case where the second direction Y intersects with the first direction X by way of example. The third direction Z is perpendicular to the first direction X, and is perpendicular to the second direction Y. For example, the second direction Y and the first direction X are both directions parallel to a main surface of the base substrate 101, the main surface of the base substrate 101 is a surface on which the pad is arranged. For example, the second direction Y is an arrangement direction in which two pads are arranged opposite to each other on the base substrate. The first direction X intersects with the second direction Y; for example, the first direction X may be at a certain angle relative to the second direction, and the embodiments of the present disclosure will be described with reference to the case where the first direction X is perpendicular to the second direction Y.

The light-emitting substrate 01 provided by the embodiments of the present disclosure may have a suitable interval distance from the edge of the opening of the reflective layer in which the pad is located, so as to reduce the "gold infiltration phenomenon", and at the same time to further reduce a risk of tilt of the light-emitting element arranged on the pad, thereby optimizing the optical performance of the light-emitting substrate.

Referring to FIG. 4-FIG. 5D, the base substrate 101 may be a printed circuit board (Printed Circuit Board, referred to as PCB) or a glass substrate. For example, a thickness range of the base substrate 101 may be 0.4 μm~3 μm, but it is not limited to this. For example, the thickness range of the base substrate 101 may be 0.35 μm~2.5 μm, but it is not limited to this. For example, the thickness of the base substrate 101 may be 0.4 μm, 1 μm, 1.5 μm, 2 μm or 3 μm.

For example, the base substrate 101 may further include a driving circuit (not illustrated in the figure), the driving circuit may include a thin film transistor and a signal line, and the driving circuit is configured to drive the light-emitting element 102 to emit light.

Referring to FIG. 4-FIG. 5D, the reflective layer 100 is arranged on the base substrate 101, at least partial boundary of the reflective layer 100 coincides with at least partial boundary of the base substrate 101, and the reflective layer 100 is provided with a plurality of openings 102. For example, the reflective layer 100 may reflect the light emitted by the light-emitting element 102 to increase an amount of light emitted from the light-emitting substrate 01 in the third direction Z perpendicular to a surface where the base substrate 101 is located, thereby improving a light-emitting efficiency of the light-emitting substrate 01.

FIG. 4 shows the case where the partial boundary of the reflective layer 100 coincides with the partial boundary of the base substrate 101. In some embodiments, the base substrate 101 may further include some functional regions not provided with the reflective layer 100, such as a region 104 configured for circuit bonding.

For example, a color of the reflective layer 100 may be selected with a better reflective characteristic, for example, the reflective layer 100 may have a white color.

For example, a material of the reflective layer 100 may include white oil, the white oil may include resin (for example, epoxy resin, polytetrafluoroethylene resin), titanium dioxide (chemical formula $TiO_2$) and organic solvent (for example, dipropylene glycol methyl ether) and the like; the material of the reflective layer 100 may further include silicone white glue. For example, in the case where the material of the reflective layer 100 includes the white oil or includes the silicon white glue, a screen printing process may be adopted to print the white oil to form the reflective layer 100. For example, a thickness range of the reflective layer 100 may be 10 μm~300 μm, for example, the thickness can be 10 μm, 50 μm, 80 μm, 155 μm, 200 μm or 300 μm. For example, the reflective layer 11 may be formed by screen printing process for one or more times.

For example, the reflective layer 100 may be formed by screen printing process for one time or more times. For example, in the case where the reflective layer 100 is produced by screen printing process for many times, a size of the opening of the reflective layer 100 may be different so as to improve a production accuracy of the reflective layer 100 near an opening region, so that the reflective layer 100 at an edge of the opening region may present a stepped shape. For example, the reflective layer 100 may further be provided with some compensation structures on an inner wall of the opening thereof, so as to compensate for the structure of the opening and to improve a size accuracy at the opening. For example, the compensation structure may adopt a material such as silicon white glue to have a color basically consistent with the color of the reflective layer 100, so as to have a certain ability to reflect light, or have a reflectivity for light as close as possible to that of the reflective layer 100. The present disclosure is not intended to limit the form of the compensation structure.

For example, the reflective layer 100 may also be a reflective sheet, for example, a white reflective sheet can be selected. For example, the reflective layer 100 may also be a reflective coating or the like, and the embodiments of the present disclosure are not intended to limit the form of the reflective layer 100.

For example, the orthographic projection of the opening 103 in the reflective layer 100 on the base substrate 101 may be circular, triangular or rectangular, and the like, and the embodiments of the present disclosure are not intended to limit the shape of the opening 103.

The embodiments of the present disclosure adopt a reflow soldering process to achieve soldering of the light-emitting element 102 and the pad 201, and an orthographic projection area of the opening 103 in the reflective layer 100 on the base substrate 101 is greater than an orthographic projection area of the pad 201 on the base substrate 101. For example, an orthographic projection region of the pad 201 on the base substrate 101 is completely surrounded by an orthographic projection region of the opening 103 in the reflective layer 100 on the base substrate 101. Therefore, the pad 201 has a certain interval distance from the opening 103 in the first direction X or the second direction Y, thereby reducing a risk of short circuit due to the "gold infiltration phenomenon".

For example, the pad 201 may adopt a metal material, for example, the metal material includes aluminum, copper, and the like.

Referring to FIG. 4-FIG. 5D, a maximum size of the opening 103 in the first direction X is H1, and a maximum size of the opening 103 in the second direction Y is greater than the maximum size H1 in the first direction X. Two pads 201 are arranged opposite to each other at intervals in the opening 103, and the second direction Y is adopted as a line-outlet direction; the orthographic projection of the pad 201 on the base substrate 101 overlaps with an orthographic projection of two edges of the opening 103 in the second direction Y on the base substrate 101; at this time, an interval exists between the pad 201 and the opening 103 in the first direction X. In some embodiments of the present disclosure, the orthographic projection of the opening 103 on the base substrate 101 may also be other shapes, the two pads 201 may also adopt the first direction X as the line-outlet direction, and an interval exists between the pad 201 and the opening 103 in the second direction Y.

It should be noted that the line-outlet direction of the light-emitting substrate in the embodiments of the present disclosure indicates a trace extension direction of a signal line configured to connect the light-emitting elements in the light-emitting substrate. For example, in some embodiments of the present disclosure, each pad may be a part of the signal line, for example, each pad may be one end of the signal line. For example, two pads arranged opposite to each other can be configured as two ends of two signal lines to conduct two connecting electrodes of the light-emitting element, respectively, which causes the light-emitting element to emit light. For example, the line-outlet direction may be the first direction X or the second direction Y illustrated in the embodiments of the present disclosure. For example, in some embodiments of the present disclosure, the line-outlet direction may also be other direction intersecting with the first direction X, which is not limited herein.

Of course, in some embodiments of the present disclosure, the pads may further be arranged individually, that is, each pad may be arranged on the base substrate as an independent conductive element and connected with the light-emitting element through a signal line to drive the light-emitting element to emit light. Embodiments of the present disclosure are not intended to limit whether the pad and the signal line are integrally formed.

Referring to FIG. 4-FIG. 5D, the light-emitting element 102 further includes a light-emitting portion 302 arranged on a side of the first electrode 202 and the second electrode 203 away from the base substrate 101 and is configured to emit light in a corresponding wavelength range. A plurality of light-emitting elements 102 are arranged in an array on the base substrate 101 to form a plurality of light-emitting element rows and a plurality of light-emitting element columns; the plurality of light-emitting element columns are arranged sequentially in the first direction X, and an interval of adjacent light-emitting element columns is basically equal; light-emitting elements arranged uniformly allows for more uniform light-emitting brightness of the light-emitting elements. Of course, an arrangement manner of the plurality of light-emitting elements 102 is not limited to what is illustrated in FIG. 4, and can be determined as needed. For example, the spacing of adjacent light-emitting element columns may be unequal, and can be determined according to a specific light-emitting requirement of the light-emitting substrate, which is not limited in the embodiments of the present disclosure.

Referring to FIG. 5A-FIG. 5D, the light-emitting element 102 includes a first electrode 202 and a second electrode 203, and the light-emitting element 102 is connected with the pad 201 through the first electrode 202 and the second electrode 203, thereby realizing a connection with the driving circuit on the base substrate 101 to drive the light-emitting element 102 to emit light by the driving circuit.

For example, one of the first electrode 202 and the second electrode 203 is a P electrode of the light-emitting element 102, and the other of the first electrode 202 and the second electrode 203 is an N electrode of the light-emitting element 102.

For example, the first electrode 202 and the second electrode 203 of the light-emitting element 102 are both made of a conductive material. For example, one of the first electrode 202 and the second electrode 203 in the light-emitting element 102 adopts a metal material, for example, the metal material includes aluminum; and the other of the first electrode 202 and the second electrode 203 in the light-emitting element 102 includes a conductive metal oxide, for example, the metal oxide includes indium tin oxide (ITO), and the like.

Referring to FIG. 5A-FIG. 5E, for example, the connecting portion 105 is solder. For example, the connecting portion 105 may include solder paste, and achieves a connection between the light-emitting element 102 and the pad 202 by a reflow soldering process. According to the characteristic of the connecting portion 105, it will present like a paste when heated and liquefied; the first electrode 202 and the second electrode 203 of the light-emitting element 102 are affected by gravity and other factors, so that the connecting portion 105 is squeezed in the third direction Z, and therefore a cooled connecting portion 105 forms a flat region 160 in an area contacted with the first electrode 202 or the second electrode 203, and an edge radian region 150 is formed at both sides of the flat region 160. The edge radian region 150 is located at both sides of the flat region 160 and includes a maximum size M in the first direction X, wherein a size N of the edge radian region 150 in the second direction Y is approximately the same as a maximum size of the flat region 160 in the second direction Y. For example, a size and a shape of the edge radian region 150 may vary depending on the number and the state of the connecting portion 105, which results in that a maximum size M of the edge radian region 150 in the first direction X is varied. For example, in some embodiments of the present disclosure, the edge radian regions 150 at both sides of the flat region 160 may have different sizes; that is, as illustrated in FIG. 5B, the edge radian regions 150 located at both sides of the flat region 160 may have a maximum size M and a maximum size Q in the first direction, respectively, which are different from each other.

For example, in some embodiments of the present disclosure, the connecting portion 105 may have different sizes in the third direction Z. For example, the connecting portion 105 may also have different sizes in the second direction Y; for example, the edge radian region 150 of the connecting portion 105 may have edges of different radians; for example, a shape of the edge radian region 150 of the connecting portion 105 may not have any symmetry. Therefore, the size of the edge radian region 150 of the connecting portion 105 in the first direction X may present difference in different degrees according to an actual product structure or different environmental states, and the embodiments of the present disclosure are not intended to limit the state of the connecting portion 105.

Referring to FIG. 5C-FIG. 5F, in the case where the light-emitting element 102 is arranged in match with the pad 201, the first electrode 202 or the second electrode 203 in the light-emitting element 102 is not completely coincident with its corresponding pad 201; that is, an orthographic projection of the first electrode 202 or the second electrode 203 on the base substrate 101 is not completely coincident with an orthographic projection of its corresponding pad 201 on the base substrate 101, for example, a certain non-overlapping region 206 (as illustrated in FIG. 5E) can exist. The pad 201 includes a first pad 204, and the first pad 204 includes a first size portion 205.

For example, a minimum size of the first size portion 205 in the first direction X is greater than a maximum size K1 of the first electrode 202 or the second electrode 203 in the first direction X. For example, a minimum distance between the first size portion 205 and the opening 103 in the first direction X may be non-uniform, e.g., 50 μm≤H1−2K2−K1≤100 μm, so that the first size portion 205 can provide a flat region with a large size in the first direction X for the first electrode 202 or the second electrode 203. At the same time, a minimum distance between the first size portion 205 and the opening 103 in the first direction X is a second size K2, and the second size K2 satisfies: K2≤0.5H1−0.5(K1+2M), for example, K2 can be ⅓-¾ of 0.5H1−0.5(K1+2M); for example, K2 can be ⅓-⅔ of 0.5H1−0.5(K1+2M); for example, K2 can be ½-⅔ of 0.5H1−0.5(K1+2M); for example, K2 can be ⅕-½ of 0.5H1−0.5(K1+2M).

For example, referring to FIG. 5A to FIG. 5E, the connecting portion 105 arranged between the pad 201 and the first electrode 202 or the second electrode 203 will have the edge radian region 150. For example, a value range of the maximum size M in the first direction X of the edge radian region 150 can be 30 μm~50 μm. For the first size portion 205, the flat region 160 in the connecting portion 105 may have a larger size in the first direction X. e.g., 50 μm≤H1−2K2−K1≤100 μm, so that the first size portion 205 is arranged to allow the first electrode 202 or the second electrode 203 to be in sufficient contact with the pad 201, thereby enhancing a connecting effect.

Therefore, with such arrangement of the light-emitting substrate 01, the pad 201 can have an appropriate interval distance with the reflective layer 100 around it, so as to reduce the risk of "gold infiltration phenomenon"; at the same time, it can also facilitate the sufficient contact between the pad 201 and each of the first electrode 202 and the second electrode 203 in a large flat region, improve the connecting effect, reduce the probability of tilt of the light-emitting element 102 arranged on the pad 201, and hence optimize the optical performance of the light-emitting substrate 01.

For example, as illustrated in FIG. 5C, the first pad 204 further includes a second size portion 207, a maximum distance between the second size portion 207 and the opening 103 in the first direction X is a third size H2, and the third size H2 satisfies: 0.5H1−0.6K1≤H2≤5H1−0.4K1.

Referring to FIG. 5C-FIG. 5E, for the first pad 204, the second size portion 207 is arranged at a side of the first size portion 205 close to a first centerline R1, and an average size of the second size portion 207 in the first direction X is smaller than an average size of the first size portion 205 in the first direction X. For example, the minimum size of the first size portion 205 in the first direction X may be equal to a size of the second size portion 207 in the first direction X. For example, in the case where the orthographic projection of the light-emitting element 102 on the base substrate 101 is a narrow and long rectangle and the orthographic projection of the light-emitting element 102 on the base substrate 101 at least partially overlaps with the orthographic projection of the opening 103 on the base substrate 101, a non-overlapping region 206 can exist between the first electrode 202 and the second size portion 207 of the first pad 204, and the third size H2 satisfies: 0.5H1−0.6K1≤H2≤0.5H1−0.4K1.

For example, a desirable range of H1 can be 0.3 μm-0.4 μm; for example, the desirable range for H1 can be 0.32 μm-0.39 μm; for example, the desirable range for H1 can further be 0.35 μm-0.38 μm. For example, a range of H2 can be 0.07 μm-0.12 μm; for example, the range of H2 can be 0.08 μm-0.10 μm; for example, the range of H2 can further be 0.05 μm-0.15 μm.

Therefore, the second size portion 207 may further increase the spacing between the first pad 204 and the opening 103 in the first direction X, which can further reduce the risk of "gold infiltration phenomenon".

At the same time, referring to FIG. 5A-FIG. 5F, in the case where the light-emitting element 102 has a tilt or deviation, the first electrode 202 or the second electrode 203 of the light-emitting element 102 may have a region deviate from the pad, that is, the non-overlapping region 206 (as illustrated in FIG. 5E). At this time, referring to FIG. 5C, by setting the third size H2 to satisfy: 0.5H1−0.6K1≤H2≤0.5H1−0.4K1, the first electrode 202 or the second electrode 203 will contact with the edge radian region 150 in the connecting portion 105 corresponding to the second size portion 207; in this way, when the first electrode 202 or the second electrode 203 has a tendency of tilt or deviation due to factors such as reflux wind or gravity, it will be subjected to a surface tension from the edge radian region 150 in the connecting portion 105 corresponding to the second size portion 207, so as to resist such tendency.

For example, in the case where the third size H2 satisfies the above formula, the size of the second size portion 207 in the first direction X is smaller than the size of the first size portion 205 in the first direction X (except where the first size portion 205 and the second size portion 207 are connected); therefore, compared to the first size portion 205, the second size portion 207 corresponds to more area of the edge radian region 150 capable of contacting with the first electrode 202 or the second electrode 203, so that the first electrode 202 or the second electrode 203 can be subjected to a larger surface tension generated by the edge radian region.

For example, as illustrated in FIG. 5F, during a soldering process, in the case where the light-emitting element 102 is tilted or has a tendency to be tilted, the tension of the edge radian region 150 in the connecting portion 105 corresponding to the second size portion 207 may correct a position of the light-emitting element 102 to reduce a portion of the light-emitting element 102 located in a deviation region 213, until the connecting portion 105 reaches a tension balance, which allows the light-emitting element 102 to be recovered from or roughly recovered from a deviation state illustrated in FIG. 5F to a normal state illustrated in FIG. 5E. That is, the edge radian region 150 in the connecting portion 105 corresponding to the second size portion 207 may pull the light-emitting element 102 back to a center position or a position close to the center under an action of the tension of the edge radian region 150.

It should be noted that the situation of position deviation of the light-emitting element illustrated in FIG. 5F is only exemplary, which is an intermediate situation that may occur during an arrangement process of the light-emitting substrate provided in the present disclosure, rather than a final state. In some embodiments of the present disclosure, for example, a deviation amount that may occur in the light-emitting element may not be equal to the deviation amount illustrated in FIG. 5F. For example, a deviation direction that may occur in the light-emitting element may also be different from the deviation direction illustrated in FIG. 5F, which is not limited in the embodiments of the present disclosure.

Therefore, with such arrangement of the second size portion 207, it can further reduce the risk of "gold infiltration phenomenon", and at the same time effectively reduce the probability of a tilt or deviation of the first electrode 202 or the second electrode 203.

For example, referring to FIG. 5C to FIG. 5E, the at least one pad 201 further includes a second pad 208; the first pad 204 and the second pad 208 are distributed at intervals and are symmetrical relative to a first centerline R1 (as illustrated in FIG. 5C) located between the first pad 204 and the second pad 208.

For example, as illustrated in FIG. 5C, the first centerline R1 extends in the first direction X. As illustrated in FIG. 5C, the first centerline R1 does not overlap with the first pad 204, and does not overlap with the second pad 208, either. As illustrated in FIG. 5C, the first pad 204, the first centerline R1, and the second pad 208 are arranged sequentially in the second direction Y.

As illustrated in FIG. 5D, the first electrode 202 and the second electrode 203 are symmetrically distributed relative to a second centerline R2 located between the first electrode 202 and the second electrode 203 located in the light-emitting element 102.

As illustrated in FIG. 5D, the second centerline R2 extends in the first direction X. As illustrated in FIG. 5D, the second centerline R2 does not overlap with the first electrode 202, and does not overlap with the second electrode 203, either. As illustrated in FIG. 5D, the first electrode 202, the second centerline R2, and the second electrode 203 are arranged sequentially in the second direction Y.

For example, in the embodiments of the present disclosure, the first centerline R1 and the second centerline R2 are dummy lines and may not exist in an actual product. For example, in the embodiments of the present disclosure, components arranged at both sides of each centerline (for example, the first pad 204 and the second pad 208 arranged at both sides of the first centerline R1, or the first electrode 202 and the second electrode 203 arranged at both sides of the second centerline R2) may also not be strictly symmetrical; for example, they can be approximately symmetrical within a certain error range. For example, various components may have a symmetry error of 3%-10% when arranged at both sides of the centerline, which is not limited in the embodiments of the present disclosure. For example, referring to FIG. 5C and FIG. 5E, at least one pad 201 is arranged at a side of the first electrode 202 and the second electrode 203 close to the base substrate 101; a minimum distance between the first electrode 202 and the second electrode 203 in the second direction Y is a fourth size Z; a minimum distance between the first pad 204 and the second pad 208 in the second direction Y is a fifth size D, e.g., $0.9Z \leq D \leq Z$, so that the light-emitting element 102 is not easy to have a tilt or deviation under the action of tension of the connecting portion 105.

Referring to FIG. 5C to FIG. 5E, an orthographic projection of the first pad 204 on the base substrate 101 and an orthographic projection of the second pad 208 on the base substrate 101 have the same shape and the same size, and are distributed symmetrically relative to the first centerline R1. In some embodiments of the present disclosure, the orthographic projection of the first pad 204 on the base substrate 101 and the orthographic projection of the second pad 208 on the base substrate 101 may also have different shapes and sizes, which is not limited here. In the second direction, the first pad 204 and the second pad 208 are distributed at intervals to avoid a phenomenon of short circuit between lines. For example, a value range of the fifth size D of the first pad 204 and the second pad 208 in the second direction Y may be 0.1 μm to 0.4 μm; for example, the value range of the fifth size D may be 0.12 μm-0.25 μm; for example, the value range of the fifth size D may be 0.13 μm-0.20 μm. The first electrode 202 and the second electrode 203 are also distributed at intervals, for example, a value range of the fourth size Z of the first electrode 202 and the second electrode 203 in the second direction Y may be 0.1 μm-0.3 μm; for example, a value range of the fourth size Z may be 0.12 μm-0.20 μm; for example, the value range of the fourth size Z may be 0.13 μm-0.15 μm.

Referring to FIG. 5C to FIG. 5E, in the case where the light-emitting element 102 is arranged at the side of the pad 201 away from the base substrate 101, the fourth size Z and the fifth size D satisfy: $0.9Z \leq D \leq Z$; that is, the fifth size D is smaller than or equal to the fourth size Z.

For example, referring to FIG. 5C to FIG. 5E, the fifth size D is smaller than the fourth size Z, so that an orthographic projection of an end of the first pad 204 close to the first centerline R1 on the base substrate includes a portion not covered by the orthographic projection of the first electrode 202 on the base substrate. As illustrated in FIG. 5E, in the second direction Y, the first electrode 202 is farther away from the first centerline R1 than the first pad 204; and at the same time, a size of the first electrode 202 close to the first centerline R1 in the first direction X is not much different from a size of the first pad 204 close to the first centerline R1 in the first direction X; as illustrated in FIG. 5E, the size of the first electrode 202 in the first direction X is slightly smaller than the size of the first pad 204 in the first direction X, as a result, the light-emitting element 102 is not easy to have a tilt or deviation under the tension of the connecting portion 105, so that the light-emitting substrate 01 can have a good optical performance.

For example, referring to FIG. 5A-FIG. 5E, a minimum distance between the first size portion 205 and the first centerline R1 in the second direction Y is a sixth size C1, and a minimum distance between the second size portion 207 and the first centerline R1 in the second direction Y is a seventh size C2; a maximum distance between the first electrode 201 and the second centerline R2 in the second direction Y is an eighth size Y1, wherein $Y=\text{MAX}(C1, C2)$, which is beneficial to improving an arrangement effect of the light-emitting element 102 on the first pad 204, so as to reduce the probability of a tilt or deviation that the light-emitting element 102 arranged on the pad may occur.

Referring to FIG. 5A-FIG. 5E, the sixth size C1 between the first size portion 205 and the first centerline R1 in the second direction Y and the seventh size C2 between the second size portion 207 and the first centerline R1 in the second direction Y satisfy $Y=\text{MAX}(C1, C2)$, and a difference value between the sixth size C1 and the seventh size C2 is roughly the same as the size of the first electrode 202 or the second electrode 203 in the second direction Y. For example, an edge line of the first electrode 202 away from the second centerline R2 is basically arranged at one end of the first size portion 205 of the first pad 204 close to the first centerline R1. In this way, the first size portion 205 can provide a large arrangement region for the first electrode 202, so that a portion of the first electrode 202 in a direction of the second direction Y away from the second centerline R2 can be arranged on the flat region 160 of the connecting portion 105 as much as possible, which is beneficial to improving an arrangement effect of the light-emitting element 102 on the first pad 204, so as to reduce the probability of a tilt or deviation that the light-emitting element 102 arranged on the pad may occur.

In order to achieve an appropriate interval distance between the pad and the reflective layer around it, to reduce the risk of "gold infiltration phenomenon", and at the same time to effectively avoid the deviation or tilt of the light-emitting element arranged on the pad, and to optimize the optical performance of the light-emitting substrate, the pad in the embodiments of the present disclosure may be arranged in various forms according to an actual design requirement.

For example, referring to FIG. 5A-FIG. 5C, in the second direction Y, a maximum distance between an edge of the first pad 204 away from the second pad 208 and an edge of the second pad 208 away from the first pad 204 is equal to a maximum size of the opening 103; the first size portion 205 and the second size portion 207 each include a first end 209/211 and a second end 210/212 opposite to each other; the first end 209 of the first size portion 205 is closer to the first centerline R1 than the second end 210 of the first size portion 205; and the first end 211 of the second size portion 207 is closer to the first centerline R1 than the second end 212 of the second size portion 207.

Referring to FIG. 5A-FIG. 5C, the maximum distance between the edge of the first pad 204 away from the second pad 208 and the edge of the second pad 208 away from the first pad 204 is equal to the maximum size of the opening, and both are C3. The pad 201 arranged in this manner adopts the second direction Y as the line-outlet direction, and an interval exists between the pad 201 and the opening 103 in the first direction X. For example, the first end of the first size portion 205 or the second size portion 207 is an edge line of the first size portion 205 or the second size portion 207 close to the first centerline R1; the second end of the first size portion 205 or the second size portion 207 is an edge line of the first size portion 205 or the second size portion 207 away from the first centerline R1, so that the first end of the first size portion 205 or the second size portion 207 is closer to the first centerline R1 than the second end of the first size portion 205 or the second size portion 207. For example, in some embodiments of the present disclosure, an edge line of an orthographic projection of the first size portion 205 or the second size portion 207 on the base substrate 101 may not be a straight line, for example, may include an arc line, and the like, which is not limited here.

For example, referring to FIG. 5A-FIG. 5C, in the first direction X, the minimum distance between the first size portion 205 and the opening 103 is the second size K2, and a maximum distance between the first end 211 of the second size portion 207 and the opening is the third size H2.

Referring to FIG. 5A-FIG. 5C, the first pad 204 includes the first size portion 205 and the second size portion 207 connected with each other, and the first size portion 205 is arranged at an end of the second size portion 207 away from the first centerline R1. In some embodiments of the present disclosure, according to an actual pad design requirement, in the case where the first size portion 205 is electrically connected to the second size portion 207, a certain interval can exist between the first size portion 205 and the second size portion 207, and a size and a shape of the interval is not limited by the embodiments of the present disclosure.

For example, as illustrated in FIG. 5C, the first pad 204 may further include other portions in addition to the first size portion 205 and the second size portion 207, for example, a third connecting portion 2171 for electrically connecting the first pad 204 with an electrical circuit structure outside the opening 103. For example, a size of the third connecting portion 2171 in the second direction may be smaller than the size of the second size portion 207 in the second direction; for example, a size of the third connecting portion 2171 in the first direction may be greater than the size of the second size portion 207 in the first direction, thereby further expanding the range of the flat region 160 in the connecting portion 105 to enhance a stability of the light-emitting element 102 arranged at the side of the first pad 204 away from the base substrate 101.

Referring to FIG. 5A-FIG. 5C, when the first size portion 205 extends from the first end 209 to the second end 210 in the second direction Y, the size of the first size portion 205 gradually increases in the first direction X, and the distance between the first size portion 205 and the opening 103 gradually decreases in the first direction X. At this time, the first end 209 of the first size portion 205 has the greatest distance to the opening 103 in the first direction X, as compared to the other parts of the first size portion 205. The orthographic projection of the second size portion 207 on the base substrate 101 and the orthographic projection of the first size portion 205 on the base substrate 101 have similar shape features; therefore, the first end 211 of the second size portion 207 also has the greatest distance to the opening 103 in the first direction X, as compared to the other parts of the second size portion 207. In the first pad 204, a size of the first end 211 of the second size portion 207 is the smallest in the first direction X. Therefore, the first pad 204 with such structure can maintain a certain interval distance from the opening 103, which can reduce the occurrence of "gold infiltration phenomenon". The first size portion 205 may be arranged at a side of the second size portion 207 away from the first centerline R1, so that the connecting portion 105 arranged on the first size portion 205 may have a large flat region 160, thereby further reducing the risk of a tilt of the light-emitting element 102.

For example, as illustrated in FIG. 5C, an orthographic projection of the first size portion 205 on the base substrate 101 and an orthographic projection of the second size portion 207 on the base substrate 101 may both be trapezoid.

Figure 6A:
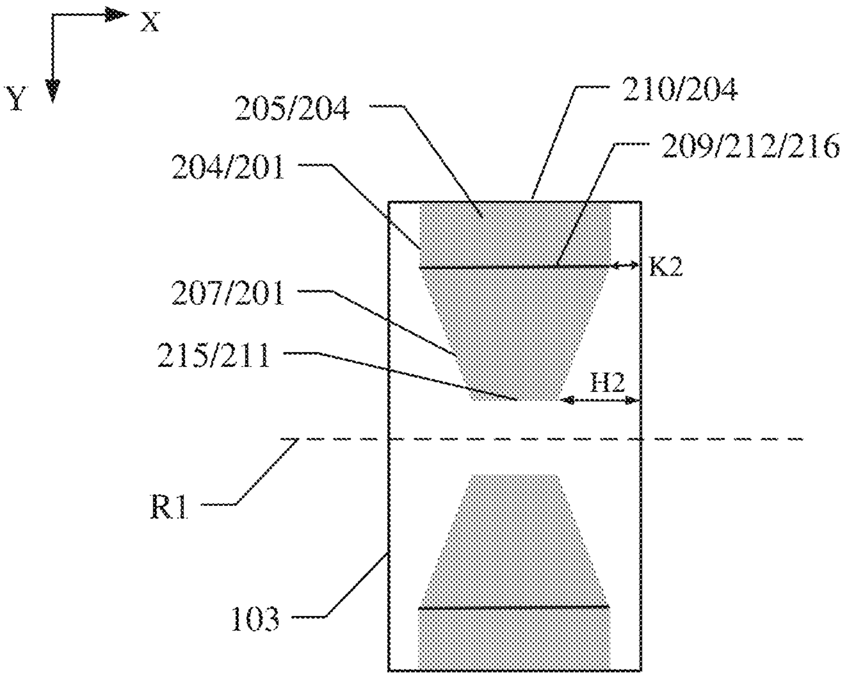
FIG. 6A is a schematic diagram of a pad structure in another light-emitting substrate provided by an embodiment of the present disclosure.
Figure 6B:
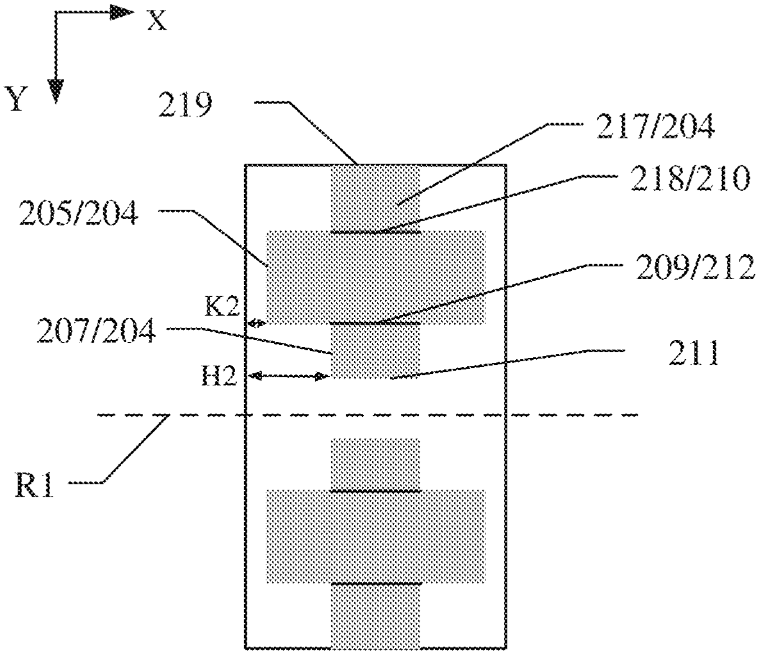
FIG. 6B is a schematic diagram of a pad structure in yet another light-emitting substrate provided by an embodiment of the present disclosure.
Figure 6C:
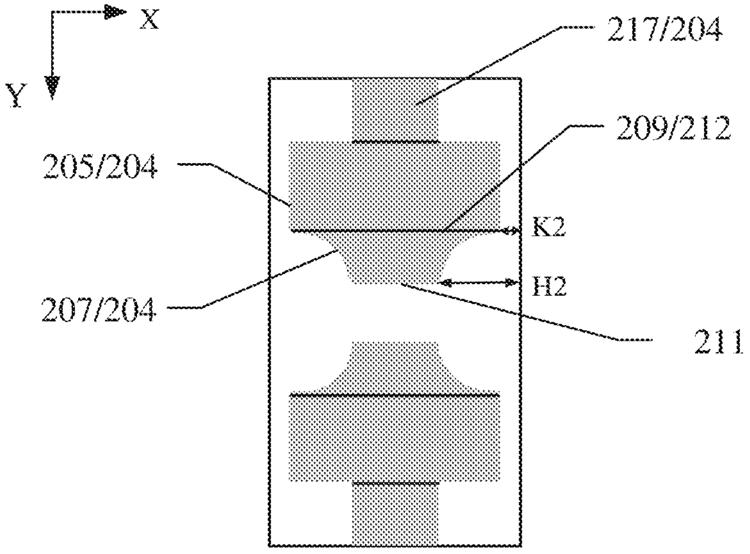
FIG. 6C is a schematic diagram of a pad structure in further another light-emitting substrate provided by an embodiment of the present disclosure.
Figure 6D:
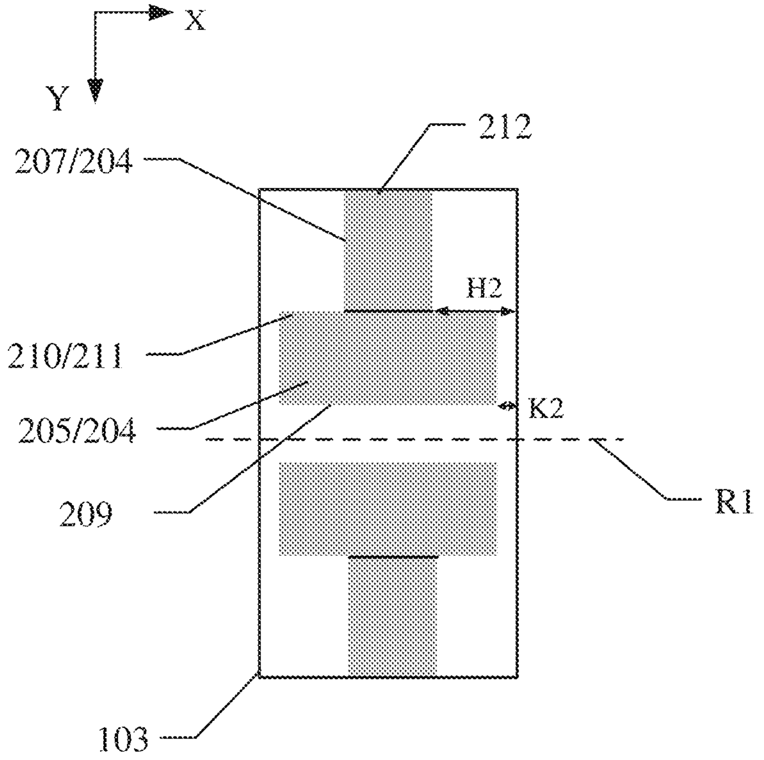
FIG. 6D is a schematic diagram of a pad structure in further another light-emitting substrate provided by an embodiment of the present disclosure.
Figure 6E:
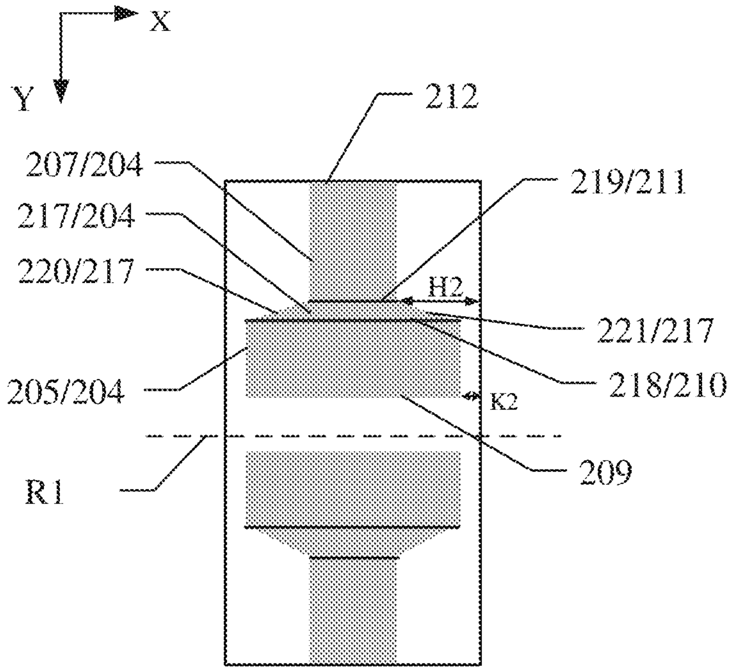
FIG. 6E is a schematic diagram of a pad structure in further another light-emitting substrate provided by an embodiment of the present disclosure.
Figure 6F:
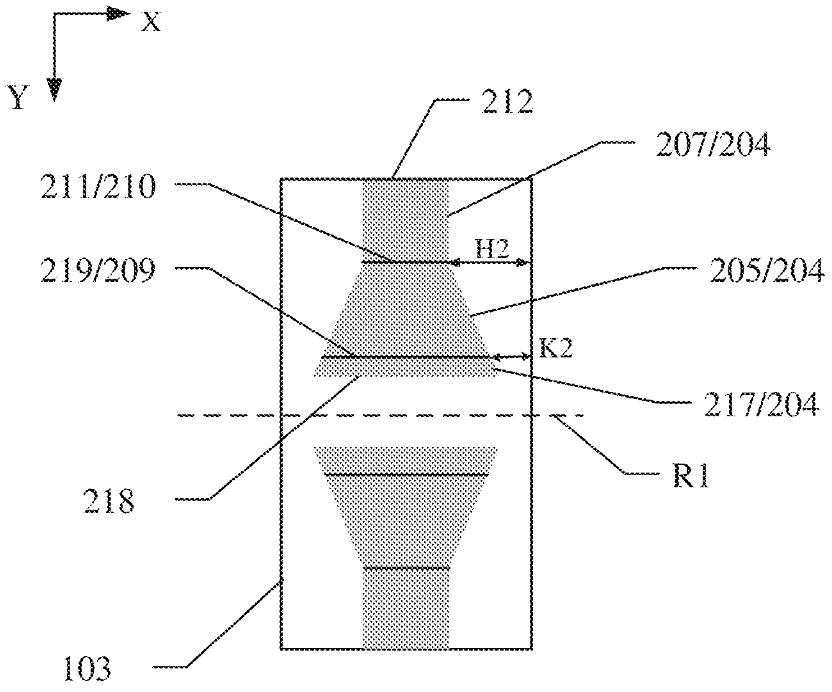
FIG. 6F is a schematic diagram of a pad structure in further another light-emitting substrate provided by an embodiment of the present disclosure.
Figure 6G:
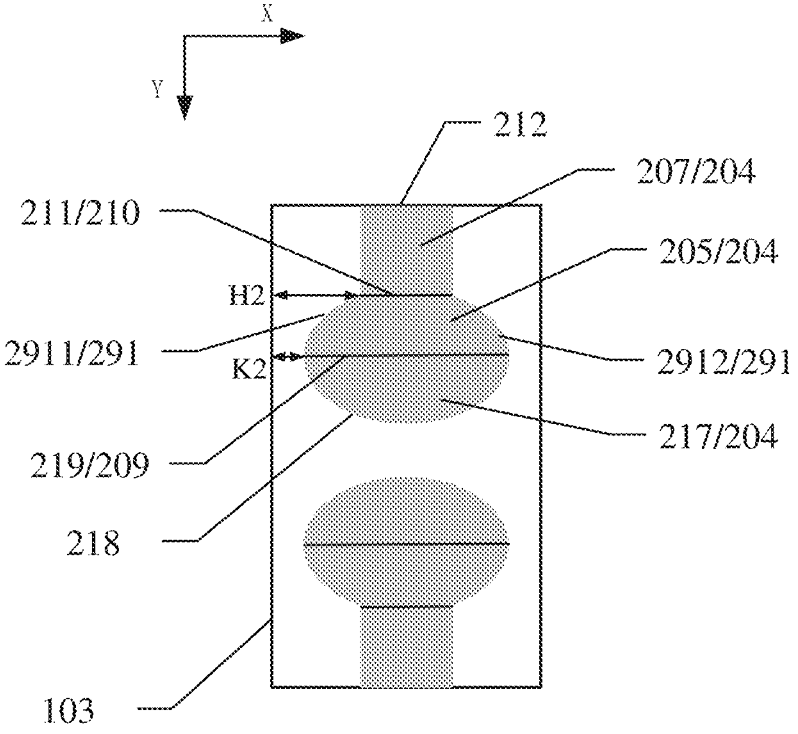
FIG. 6G is a schematic diagram of a pad structure in further another light-emitting substrate provided by an embodiment of the present disclosure.
Figure 6H:
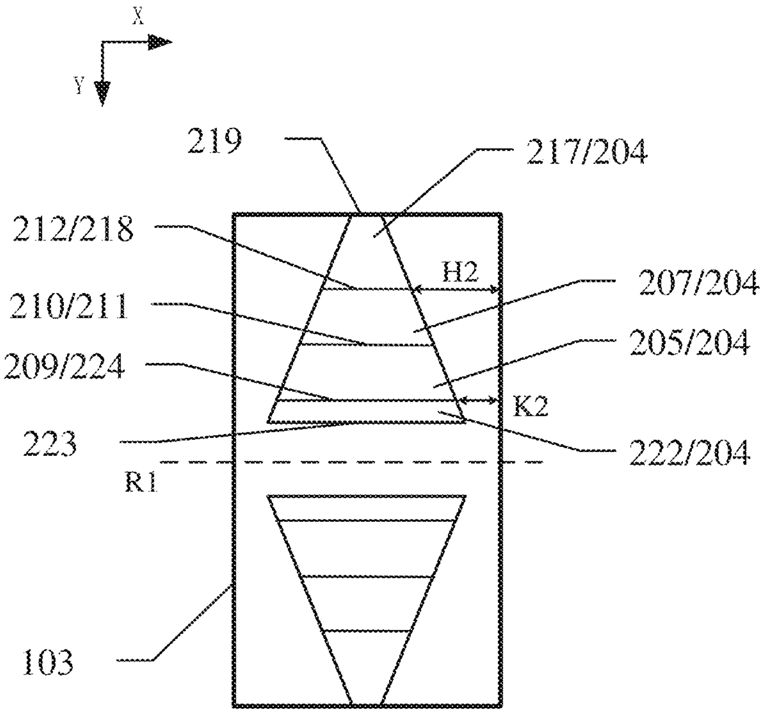
FIG. 6H is a schematic diagram of a pad structure in further another light-emitting substrate provided by an embodiment of the present disclosure.
Figure 7:
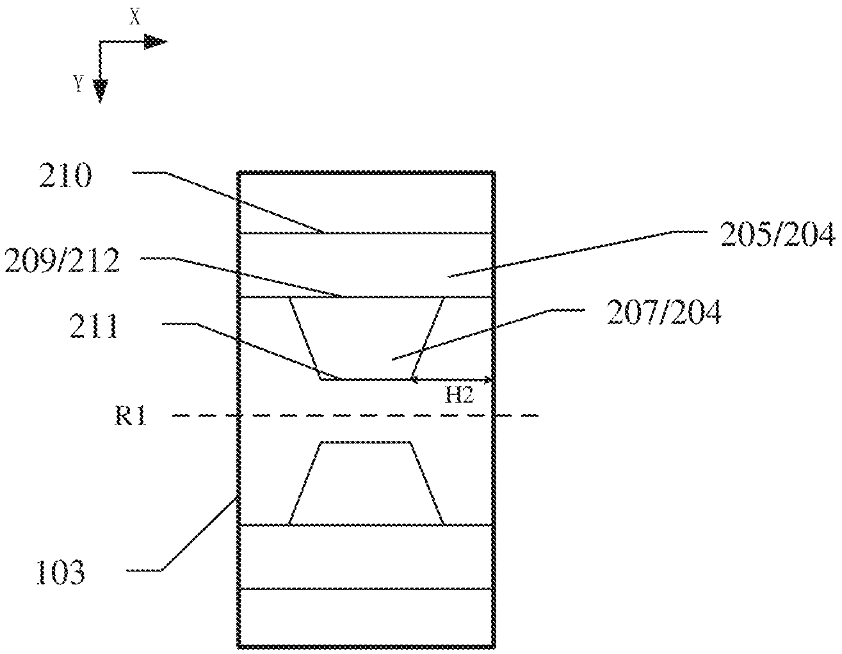
FIG. 7 is a schematic diagram of a pad structure in further another light-emitting substrate provided by an embodiment of the present disclosure.

FIG. 6A is a schematic diagram of a pad structure in another light-emitting substrate provided by an embodiment of the present disclosure; FIG. 6B is a schematic diagram of a pad structure in yet another light-emitting substrate provided by an embodiment of the present disclosure; FIG. 6C is a schematic diagram of a pad structure in further another light-emitting substrate provided by an embodiment of the present disclosure; FIG. 6D is a schematic diagram of a pad structure in further another light-emitting substrate provided by an embodiment of the present disclosure; FIG. 6E is a schematic diagram of a pad structure in further another light-emitting substrate provided by an embodiment of the present disclosure; FIG. 6F is a schematic diagram of a pad structure in further another light-emitting substrate provided by an embodiment of the present disclosure; FIG. 6G is a schematic diagram of a pad structure in further another light-emitting substrate provided by an embodiment of the present disclosure; FIG. 6H is a schematic diagram of a pad structure in further another light-emitting substrate provided by an embodiment of the present disclosure; and FIG. 7 is a schematic diagram of a pad structure in further another light-emitting substrate provided by an embodiment of the present disclosure.

For example, referring to FIG. 5A and FIG. 6A, an orthographic projection of the first size portion 205 on the base substrate 101 may also be rectangular, and a size of the first size portion 205 in the first direction X is greater than a size of the first size portion 205 in the second direction Y, and an orthographic projection of the second end 210 of the first size portion 205 on the base substrate 101 overlaps with the orthographic projection of the opening 103 on the base substrate 101; an orthographic projection of the second size portion 207 on the base substrate 101 may be a trapezoid, the second size portion 207 includes an upper bottom 215 and a lower bottom 216 parallel to the first centerline R1, and a distance between the upper bottom 215 and the opening 103 in the first direction X is greater than a distance between the lower bottom 216 and the opening 103 in the first direction X. As illustrated in FIG. 6A, a length of the upper bottom 215 is smaller than a length of the lower bottom 216.

Referring to FIG. 5A and FIG. 6A, in the first direction X, the first size portion 205 and the second size portion 207 both have a certain interval from the opening 103, and a distance between the first size portion 205 and the opening 103 in the first direction X is generally smaller than a distance between the second size portion 207 and the opening 103 in the first direction X, and the risk of "gold infiltration phenomenon" of the first pad 204 can be reduced.

Referring to FIG. 5A, FIG. 5B and FIG. 6A, for the second size portion 207 whose orthographic projection on the base substrate 101 is a trapezoid, the upper bottom 215 thereof is a first end 211, the lower bottom 216 thereof is a second end 212, and the distance between the upper bottom 215 and the opening 103 in the first direction X is greater than the distance between the lower bottom 216 and the opening 103 in the first direction X; in this way, the upper bottom 215 corresponds to more area of the edge radian region 150 capable of contacting with the first electrode 202 or the second electrode 203, so that the first electrode 202 or the second electrode 203 may be subjected to a larger tension generated by the edge radian region 150, which can restrain the light-emitting element 102 from deviation that may occur and hence enhance the optical performance of the light-emitting substrate 01.

The principle of avoiding the "gold infiltration phenomenon" of the first pad 204 by reasonable arrangement, and the principle of enhancing the optical performance of the light-emitting substrate can refer to relevant description in the above embodiments, which will not be repeated here.

For example, referring to FIG. 5A and FIG. 6B, an orthographic projection of the first size portion 205 on the base substrate 101 and an orthographic projection of the second size portion 207 on the base substrate 101 are rectangular, and a size of the first size portion 205 in the first direction X is greater than a size of the first size portion 205 in the second direction Y; a size of the second size portion 207 in the first direction X is greater than a size of the second size portion 207 in the second direction Y.

For example, referring to FIG. 5A and FIG. 6B, the first pad 204 further includes a third size portion 217, the third size portion 217 includes a first end 218 and a second end 219 opposite to each other, and the first end 218 of the third size portion 217 is connected with the second end 210 of the first size portion 205 in the second direction Y; an orthographic projection of the second end 219 of the third size portion 217 on the base substrate 101 overlaps with the orthographic projection of the opening 103 on the base substrate 101, and a size of the third size portion 217 in the second direction Y is smaller than the size of the first size portion 205 in the second direction Y.

For example, referring to FIG. 5A and FIG. 6B, compared with the pad illustrated in FIG. 6A, the pad illustrated in FIG. 6B additionally includes the third size portion 217, the orthographic projection of the second size portion 207 on the base substrate 101 is rectangular, and a size of the second end 212 of the second size portion 207 in the first direction X is smaller than a size of the first end 209 of the first size portion 205 in the first direction X. The size of the first size portion 205 in the second direction Y is greater than the size of the second size portion 207 and the third size portion 217 in the second direction Y, so that the connecting portion 105 of the first size portion 205 arranged at a side away from the base substrate 101 has a large flat region 160, which facilitates a sufficient contact between the pad 201 and the first electrode 202 and the second electrode 203 (referring to FIG. 5B) on the large flat region 160, as well as an effective connection therebetween, thereby reducing the probability of a tilt of the light-emitting element 102 (refer to FIG. 5B) arranged on the pad 201, and then optimizing the optical performance of the light-emitting substrate 01.

The third size portion 217 has a smaller size in the first direction X, for example, the size of the third size portion 217 in the first direction X may be smaller than a size of the first size portion 205 and the third size portion 217 in the first direction; when the size of the third size portion 217 in the first direction X is smaller than the size of the first size portion 205 in the first direction X, the risk of "gold infiltration phenomenon" can be further reduced. The embodiments of the present disclosure are not intended to limit the shape of the orthographic projection of the third size portion 217 on the base substrate 101, for example, the orthographic projection of the third size portion 217 on the base substrate 101 may be a regular polygon; for example, the orthographic projection of the third size portion 217 on the base substrate 101 may include an arc-shaped structure.

For example, referring to FIG. 5A and FIG. 6C, the size of the second size portion 207 in the first direction X may gradually increase from the first end 211 of the second size portion 207 to the second end 212 of the second size portion 207, and a size of the second end 212 of the second size portion 207 in the first direction X is equal to a size of the first end 209 of the first size portion 205 in the first direction X.

Compared with the pad illustrated in FIG. 6B, the pad illustrated in FIG. 6C is merely different in that, an orthographic projection of the second size portion 207 on the base substrate 101 has an irregular arc-shaped structure.

Referring to FIG. 5A and FIG. 6C, the size of the second size portion 207 in the first direction X gradually increases from the first end 211 to the second end 212, until it is equal to the size of the first end 209 of the first size portion 205 in the first direction X. For example, in some embodiments of the present disclosure, by designing the size of the second size portion 207 in the first direction X to be gradually varied, a portion of the connecting portion 105 arranged at a side of the second size portion 207 away from the base substrate 101 can be well engaged with a portion of the connecting portion 105 arranged at a side of the first size portion 205 away from the base substrate 101, so that the flat region 160 in the connecting portion 105 can be made larger, which can optimize the arrangement effect of the light-emitting element 102, and reduce the probability of deviation or tilt of the light-emitting element 102.

Of course, the embodiments of the present disclosure are not limited to this. For example, under a premise that a function of the pad can be realized, the shape of the orthographic projection of the second size portion 207 on the base substrate 101 can be designed according to the actual design requirement, which is not limited here.

For example, referring to FIG. 5A and FIG. 6D, in the first direction X, a minimum distance between the first end 209 of the first size portion 205 and the opening 103 is the second size K2, a maximum distance between the first end 211 of the second size portion 207 and the opening 103 is the third size H2, and an orthographic projection of the second end 212 of the second size portion 207 on the base substrate 101 overlaps with the orthographic projection of the opening 103 on the base substrate 101.

Referring to FIG. 5A and FIG. 6D, the first size portion 205 is arranged at a side of the second size portion 207 close to the first centerline R1. Therefore, in the first direction X, a size of the first pad 204 has a tendency of decreasing from an end close to the first centerline R1 to an end away from the first centerline R1. In the case where the light-emitting element 102 is arranged at a side of the first pad 204 away from the base substrate 101, the second size portion 207 will restrict a portion of the light-emitting element 102 away from the first centerline R1 from a tilt or deviation; the first size portion 205 will act on a portion of the light-emitting element 102 close to the first centerline R1, which facilitates the connecting portion 105 to provide a large flat region 160 for the light-emitting element 102; moreover, a pad structure arranged in this manner can also function for reducing the "gold infiltration phenomenon".

For example, as illustrated in FIG. 6D, an orthographic projection of the first size portion 205 on the base substrate 101 may be rectangular, and a size of the first size portion 205 in the first direction X is greater than a size of the first size portion 205 in the second direction Y; an orthographic projection of the second size portion 207 on the base substrate 101 may also be rectangular, and a size of the second size portion 207 in the first direction X is smaller than a size of the first size portion 205 in the second direction Y; the first size portion 205 is connected with the second size portion 207.

As illustrated in FIG. 6D, the orthographic projection of the first size portion 205 on the base substrate 101 and the orthographic projection of the second size portion 207 on the base substrate 101 are both rectangular, so that a size of the first pad 204 decreases in a stepped manner from one end close to the first centerline R1 to another end away from the first centerline R1 in the first direction X. For example, the size of the second size portion 207 in the first direction X may further be different from the state illustrated in FIG. 6D. For example, referring to FIG. 5A and FIG. 6D, when the light-emitting element 102 has high probability to be tilted or deviated, it's possible to relatively increase the size of the second size portion 207 in the second direction Y and relatively reduce the size of the first size portion 205 in the second direction Y, thereby restraining the light-emitting element 102 from deviation or tilt in a better way.

As illustrated in FIG. 6D, in the second direction Y, the first size portion 205 is directly adjacent to the second size portion 207, and a second end 210 of the first size portion 205 is directly connected with a first end 211 of the second size portion 207. For example, in some embodiments of the present disclosure, the first size portion 205 may also be indirectly connected with the second size portion 207. For example, some other structures of the first pad 204 may also be provided between the first size portion 205 and the second size portion 207, which will not be limited in the embodiments of the present disclosure.

For example, referring to FIG. 5A and FIG. 6E, the first pad 204 further includes a third size portion 217, the third size portion 217 includes a first end 218 and a second end 219 opposite to each other; the first end 218 of the third size portion 217 is connected with the second end 210 of the first size portion 205 in the second direction Y, and the second end 219 of the third size portion 217 is connected with the first end 211 of the second size portion 207; a size of the third size portion 217 in the first direction X gradually decreases from the first end 218 of the third size portion 217 to the second end 219 of the third size portion 217, and a size of the first end 218 of the third size portion 217 in the first direction X is equal to a size of the second end 210 of the first size portion 205 in the first direction X, and a size of the second end 219 of the third size portion 217 in the first direction X is equal to a size of the first end 211 of the second size portion 207 in the first direction X.

Referring to FIG. 5A, FIG. 5B and FIG. 6E, in the second direction Y, the third size portion 217 is arranged between the first size portion 205 and the second size portion 207; and the first size portion 205, the second size portion 207 and the third size portion 217 are electrically connected. For example, the first size portion 205, the second size portion 207 and the third size portion 217 may be integrally formed. The size of the third size portion 217 in the first direction X gradually decreases from the first end 218 of the third size portion 217 to the second end 219 of the third size portion 217, so that the third size portion 217 can be configured as a transition region for size change in the first direction X of the first size portion 205 and the second size portion 207. Compared with the pad structure illustrated in FIG. 6D, the pad structure illustrated in FIG. 6E allows the connecting portion 105 arranged at a side of the first size portion 205 and the third size portion 217 away from the base substrate 101 to have a larger flat region 160, thereby optimizing an arrangement state of the light-emitting element 102, reducing the probability of tilt of the light-emitting element 102, and optimizing the optical performance of the light-emitting substrate 01.

For example, referring to FIG. 5A and FIG. 6E, an orthographic projection of the third size portion 217 on the base substrate 101 may be a trapezoid.

For example, referring to FIG. 5A and FIG. 6E, the orthographic projection of the third size portion 217 on the base substrate 101 may be other shapes. For example, the orthographic projection of the third size portion 217 on the base substrate 101 includes a first boundary 220 and a second boundary 221. For example, the first boundary 220 and the second boundary 221 of the orthographic projection of the third size portion 217 on the base substrate 101 may be straight lines, or curves or arcs. Therefore, the third size portion 217 may have a variety of structural forms, which are not limited in the embodiments of the present disclosure.

For example, as illustrated in FIG. 6F, in the first direction X, a maximum size of the second end 210 of the first size portion 205 is equal to a maximum size of the first end 211 of the second size portion 207, and the second end 210 of the first size portion 205 is connected with the first end 211 of the second size portion 207; the maximum size of the first size portion 205 in the first direction X gradually decreases from the first end 209 of the first size portion 205 to the second end 210 of the first size portion 205.

For example, as illustrated in FIG. 6F, the first pad 204 further includes a third size portion 217, the third size portion 217 includes a first end 218 and a second end 219 opposite to each other, and the second end 219 of the third size portion 217 is in matched connection with the first end 209 of the first size portion 205 in the second direction Y; a maximum size of the third size portion 217 in the first direction X gradually decreases from the first end 218 of the third size portion 217 to the second end 219 of the third size portion 217.

For example, referring to FIG. 5A and FIG. 6F, the first pad 204 includes a first size portion 205, a second size portion 207 and a third size portion 217; the third size portion 217, the first size portion 205 and the second size portion 207 are arranged sequentially in the second direction Y, wherein the third size portion 217 is arranged at a side of the first size portion 205 close to the first centerline R1, and the second size portion 207 is arranged at a side of the first size portion 205 away from the first centerline R1. An orthographic projection of the second end 212 of the second size portion 207 on the base substrate 101 overlaps with an orthographic projection of the opening 103 on the base substrate 101. For example, the size of the second size portion 207 in the first direction X may be uniform or non-uniform, which is not limited in the embodiments of the present disclosure. For example, a size of the first end 211 of the second size portion 207 in the first direction X may be equal to or different from a size of the second end 210 of the first size portion 205 in the first direction X, as long as they are electrically connected, which is not limited in the embodiments of the present disclosure. A size of the first size portion 205 in the first direction X may be non-uniform; and in the second direction Y, the size of the first size portion 205 gradually decreases from the first end 209 to the second end 210.

For example, referring to FIG. 5A and FIG. 6F, an orthographic projection of the first size portion 205 on the base substrate 101 may be a regular polygon, or may include an irregular shape, which is not limited in the present disclosure. For example, the orthographic projection of the third size portion 217 on the base substrate 101 and the orthographic projection of the first size portion 205 on the base substrate 101 have similar shape features.

For example, referring to FIG. 5A and FIG. 6F, the orthographic projection of the first size portion 205 on the base substrate 101 may be a trapezoid, and the orthographic projection of the third size portion 217 on the base substrate 101 may also be a trapezoid.

As illustrated in FIG. 6F, a size of the second end 219 of the third size portion 217 in the first direction X is equal to a size of the first end 209 of the first size portion 205 on the first direction X; and the included angles between the first end 209 of the first size portion 205 and the bevel edges at both sides of the first end 209 are equal to each other. The included angles between the first end 218 of the third size portion 217 and the bevel edges at both sides of the first end 218 are also equal to each other, and are equal to the included angles between the first end 209 of the first size portion 205 and the bevel edges at both sides of the first end 209. For example, in some embodiments of the present disclosure, the included angles between the first end 209 of the first size portion 205 and the bevel edges at both sides of the first end 209 may be unequal to each other. For example, a slope of the bevel edges at both sides of the first end 218 of the third size portion 217 may not be equal to a slope of the bevel edges at both sides of the first end 209 of the first size portion 205. For example, the size of the second end 219 of the third size portion 217 in the first direction X may also not be equal to the size of the first end 209 of the first size portion 205 in the first direction X, which is not limited in the embodiments of the present disclosure.

With such arrangement, the range of the flat region 160 of the connecting portion 105 may be further extended by the third size portion 217; in this way, the probability of "gold infiltration phenomenon" is reduced, and an arrangement state of the light-emitting element 102 can be optimized at the same time, so as to reduce the probability of tilt that the light-emitting element 102 may occur and optimize the optical performance of the light-emitting substrate 01.

For example, referring to FIG. 5A and FIG. 6G, as compared with the pad structure illustrated in FIG. 6F, for the pad illustrated in FIG. 6G, a connecting side portion between an orthographic projection of the second end 210 of the first size portion 205 on the base substrate 101 and an orthographic projection of the first end 211 of the second size portion 207 on the base substrate 101 is arc-shaped, and an orthographic projection of the first end 218 of the third size portion 217 on the base substrate 101 is arc-shaped.

For example, referring to FIG. 5A and FIG. 6G, the connecting side portion between the orthographic projection of the second end 210 of the first size portion 205 on the base substrate 101 and the orthographic projection of the first end 211 of the second size portion 207 on the base substrate 101 includes a first side portion 2911 and a second side portion 2912, and an orthographic projection of the first side portion 2911 and an orthographic projection of the second side portion 2912 on the base substrate 101 are both arc-shaped. A maximum size of the third size portion 217 in the second direction Y is substantially equal to a maximum size of the first size portion 205 in the second direction Y. The third size portion 217 is electrically connected with the first size portion 205, and the orthographic projections of the third size portion 217 and the first size portion 205 on the base substrate 101 constitute an ellipse. The second end 219 of the third size portion 217 can be well engaged with the first end 209 of the first size portion 205, which facilitates increasing the range of the flat region 160, optimizing the arrangement state of the light-emitting element 102, and reducing the probability of tilt that the light-emitting element 102 may occur.

For example, in some embodiments of the present disclosure, radians of the first side portion 2911 and of the second side portion 2912 may be different from each other, and the first side portion 2911 and the second side portion 2912 may not be symmetrical relative to each other. For example, according to the actual design requirement, the size of the third size portion 217 in the second direction Y may be not equal to the size of the first size portion 205 in the second direction Y. For example, the size of the first size portion 205 in the second direction Y may be greater than the size of the third size portion 217 in the second direction Y.

Of course, the embodiments of the present disclosure are not limited to this, and the orthographic projection of the first size portion 205 or the third size portion 217 on the base substrate 101 may also be other shapes.

For example, as illustrated in FIG. 6H, in the first direction X, a minimum distance between the first end 209 of the first size portion 205 and the opening 103 is the second size K2, a maximum distance between the first end 211 of the second size portion 207 and the opening 103 is the third size H2, and the second end 210 of the first size portion 205 is connected with the first end 211 of the second size portion 207.

For example, referring to FIG. 5A and FIG. 6H, the first pad 204 further includes the third size portion 217 and a fourth size portion 222; the third size portion 217 and the fourth size portion 222 both include a first end and second end opposite to each other; in the second direction Y, a first end 218 of the third size portion 217 is connected with a second end 212 of the second size portion 207, an orthographic projection of a second end 219 of the third size portion 217 on the base substrate 101 overlaps with an orthographic projection of the opening 103 on the base substrate, and a second end 224 of the fourth size portion 222 is connected with the first end 209 of the first size portion 205; a size of the third size portion 217 in the first direction X gradually decreases from the first end 218 of the third size portion 217 to the second end 219 of the third size portion 217; a size of the fourth size portion 222 in the first direction X gradually decreases from a first end 223 of the fourth size portion 222 to the second end 224 of the fourth size portion 222, and a size of the second end 224 of the fourth size portion 222 in the first direction X is equal to a size of the first end 209 of the first size portion 205 in the first direction X.

Referring to FIG. 5A and FIG. 6H, the first pad 204 includes the first size portion 205, the second size portion 207, the third size portion 217 and the fourth size portion 222; and in the second direction Y, the fourth size portion 222, the first size portion 205, the second size portion 207 and the third size portion 217 are arranged sequentially, and the fourth size portion 222 has the smallest distance to the first centerline R1. A distance between the first size portion 205 and the opening 103 in the first direction X increases gradually from the first end 209 to the second end 210, and the fourth size portion 222 is connected with the first end 209 of the first size portion 205 at the second end 224, thereby further expanding the range of the flat region 160 of the connecting portion 105, enhancing the stability of the first pad 204 relative to the light-emitting element 102 arranged at the side of the first pad 204 away from the base substrate 101, and reducing the probability of a tilt or deviation that may occur.

For example, referring to FIG. 5A, FIG. 5D and FIG. 6H, the size of the third size portion 217 in the first direction X gradually decreases from the first end 218 of the third size portion 217 to the second end 219 of the third size portion 217, and the first end 218 of the third size portion 217 is connected with the second end 212 of the second size portion 207. An average size of the third size portion 217 in the first direction X is smaller than an average size of the second size portion 207 in the first direction X. Therefore, in the case where the first electrode 202 of the light-emitting element 102 is arranged at the side of the first pad 204 away from the base substrate 101, an edge line 214 of the first electrode 202 that extends in the first direction X and away from the second centerline R2 is located close to the first end 218 of the third size portion 217. Therefore, with such arrangement of the first pad 204, the ability of the third size portion 217 of restraining the light-emitting element 102 from deviation can be further enhanced, so as to optimize the optical performance of the light-emitting element 102.

For example, as illustrated in FIG. 6H, orthographic projections of the first size portion 205, the second size portion 207, the third size portion 217 and the fourth size portion 222 on the base substrate 101 are all trapezoids.

For example, referring to FIG. 5A, FIG. 5D and FIG. 6H, in some embodiments of the present disclosure, the orthographic projections of the first size portion 205, the second size portion 207, the third size portion 217 and the fourth size portion 222 on the base substrate 101 may also be other shapes. For example, the connecting side portion for connecting the first end and the second end of each of the first size portion 205, the second size portion 207, the third size portion 217 and the fourth size portion 222 may be a straight line or a curve. For example, the connecting side portion for connecting the first end and the second end of each of the first size portion 205, the second size portion 207, the third size portion 217 and the fourth size portion 222 may include a broken line, an arc line, and the like, which is not limited in the embodiments of the present disclosure.

For example, referring to FIG. 5A and FIG. 6H, the sizes of the first size portion 205, the second size portion 207, the third size portion 217 and the fourth size portion 222 in the second direction Y can be determined according to the actual design requirement. For example, the size of the first size portion 205 in the second direction Y may be increased to enhance the range of the flat region 160 of the connecting portion 105 arranged at the side of the first size portion 205 away from the base substrate 101. Therefore, the structure of the first pad 204 can be flexibly designed in more manners, so that the optical performance of the light-emitting element 102 can be well optimized.

For example, as illustrated in FIG. 7, in the first direction X, a maximum size of the first size portion 205 is equal to a maximum size of the opening 103; the first size portion 205 and the second size portion 207 respectively include a first end and a second end opposite to each other, and a first end 209 of the first size portion 205 and a first end 211 of the second size portion 207 are arranged at the side close to the first centerline R1; a minimum distance between a second end 210 of the first size portion 205 and the opening 103 in the second direction Y is substantially equal to the size of the first size portion 205 in the second direction Y.

As illustrated in FIG. 7, the maximum size of the first size portion 205 in the first direction X is equal to the maximum size of the opening 103 in the first direction X, and the second size portion 207 is arranged at the side of the first size portion 205 away from the first centerline R1 in the second direction Y. Therefore, a line-outlet direction of the first pad 204 illustrated in FIG. 7 is in the first direction X, so that the first pad 204 designed in accordance with this line-outlet mode should maintain a certain distance from the opening 103 in the second direction Y, which prevents from the occurrence of the "gold infiltration phenomenon".

Referring to FIG. 5A-FIG. 5E, the sixth size C1 between the first size portion 205 and the first centerline R1 in the second direction Y and the seventh size C2 between the second size portion 207 and the first centerline R1 in the second direction Y satisfy Y=MAX(C1, C2), and a difference value between the sixth size C1 and the seventh size C2 is substantially the same as the size of the first electrode 202 or the second electrode 203 in the second direction Y. Therefore, when such design condition is satisfied, the size of the first size portion 205 in the second direction Y can be determined according to the actual design situation, which is not limited in the embodiments of the present disclosure.

For example, as illustrated in FIG. 7, a minimum distance between the second end 210 of the first size portion 205 and the opening 103 in the second direction Y may be substantially equal to the size of the first size portion 205 in the second direction. Therefore, the connecting portion 105 located at the side of the first size portion 205 away from the base substrate has a large flat region, and at the same time, an overall arrangement area of the first pad 204 is saved, thereby reducing a manufacturing cost.

Of course, the embodiments of the present disclosure are not limited to the structure form in which a line-outlet direction of the first pad 204 is the first direction X, and a third portion and/or a fourth size portion and the like may be added to the first pad 204 according to the actual design requirement. At the same time, a structure form of each size portion can also be determined according to the actual situation, so that a design of the first pad 204 is more flexible, and the optical performance of the light-emitting element can be better optimized.

For example, as illustrated in FIG. 7, the size of the first size portion 205 in the first direction X is greater than the size of the first size portion 205 in the second direction Y; the size of the second size portion 207 in the second direction Y gradually increases from the first end 211 of the second size portion 207 to the second end 212 of the second size portion 207.

For example, an orthographic projection of the first size portion 205 on the base substrate 101 may be a rectangle, and an orthographic projection of the second size portion 207 on the base substrate 101 may be a trapezoid.

For example, referring to FIG. 5D and FIG. 7, a distance between the first end 211 of the second size portion 207 and the opening 103 in the first direction X is H2, and the third size H2 satisfies: $H1/2-0.6K1 \leq H2 \leq H1/2-0.4K1$. In this way, the size of the first electrode 202 in the first direction X is close to a size of the first end 211 of the second size portion 207 in the first direction X which is close to the first center line R1. Therefore, a first pad 204 with such structure can restrain the light-emitting element 102 from a deviation or tilt.

As illustrated in FIG. 7, the size of the second size portion 207 in the second direction Y gradually increases from the first end 211 of the second size portion 207 to the second end 212 of the second size portion 207, and the second end 212 of the second size portion 207 is connected with the first end 209 of the first size portion 205. In this way, the connecting portion arranged between the first pad 204 and the light-emitting element has a large flat region, which can optimize the arrangement effect of the light-emitting element.

For example, the second size portion 207 may be of other structures, which is not limited in the embodiments of the present disclosure.

It should be noted that in each embodiment described above, for the same first pad, each size portion included in the first pad may be integrally formed with another size portion adjacent to the size portion, thereby simplifying the process and reducing the manufacturing cost. For example, in the same first pad, all of the size portions are integrally formed.

Referring to FIG. 5C to FIG. 5E, the embodiments of the present disclosure provide a light-emitting substrate 01, including: a base substrate 101, a reflective layer 100, at least one pad 201, a light-emitting element 102, and a connecting portion 105. The reflective layer 100 is arranged on the base substrate 101, and the reflective layer 100 includes an opening 103; an orthographic projection of the at least one pad 201 on the base substrate 101 at least partially overlaps with an orthographic projection of the opening 103 on the base substrate 101; the at least one pad 201 includes a first pad 204 and a second pad 208 which are distributed symmetrically relative to a first centerline R1 located between the first pad 204 and the second pad 208.

Referring to FIG. 5C to FIG. 5E, the light-emitting element 102 is arranged on the base substrate 101, an orthographic projection of the light-emitting element 102 on the base substrate 101 at least partially overlaps with the orthographic projection of the opening 103 on the base substrate 101, and the light-emitting element 102 includes a first electrode 202 and a second electrode 203 which are symmetrically distributed relative to a second centerline R2 located between the first electrode 202 and the second electrode 203.

As illustrated in FIG. 5B, the connecting portion 105 is arranged between the at least one pad 201 and the light-emitting element 102, and is configured to connect the at least one pad 201 with the light-emitting element 102.

For example, the first pad 204 is arranged at a side of one of the first electrode 202 and the second electrode 203 close to the base substrate 101, and the second pad 208 is arranged at a side of the other one of the first electrode 202 and the second electrode 203 away from the base substrate 101; a minimum interval between the first electrode 202 and the second electrode 203 in their arrangement direction is a fourth size Z, and a minimum interval between the first pad 204 and the second pad 208 in their arrangement direction is a fifth size D, $0.9Z \leq D \leq Z$.

Referring to FIG. 5C to FIG. 5E, the first pad 204 and the second pad 208 are distributed at intervals in the second direction Y, the first electrode 202 and the second electrode 203 are also distributed at intervals in the second direction Y, and the light-emitting element 102 is arranged at a side of the pad 201 away from the base substrate 101.

Referring to FIG. 5C to FIG. 5E, when the light-emitting element 102 is arranged at the side of the pad 201 away from the base substrate 101, the fourth size Z and the fifth size D satisfy: $0.9Z \leq D \leq Z$, that is, the fifth size D is smaller than or equal to the fourth size Z. In this way, the light-emitting element 102 is not easy to have a tilt or deviation under the tension of the connecting portion 105, so as to achieve a good optical performance.

Structure characteristics of the light-emitting substrate 01 may refer to relevant description in the aforementioned embodiments, and will not be repeated here.

For example, referring to FIG. 5A-FIG. 5E, the embodiments of the present disclosure provide a light-emitting substrate, including: a base substrate 101, a reflective layer 100, at least one pad 201, a light-emitting element 102, and a connecting portion 105. The reflective layer 100 is arranged on the base substrate 101, and the reflective layer 100 includes an opening 103.

For example, referring to FIG. 5A-FIG. 5E, an orthographic projection of the at least one pad 201 on the base substrate 101 at least partially overlaps with an orthographic projection of the opening 103 on the base substrate 101, and the at least one pad 201 includes a first pad 204 and a second pad 208 which are symmetrically distributed relative to a first centerline R2 located between the first pad 204 and the second pad 208.

For example, referring to FIG. 5A-FIG. 5E, the light-emitting element 102 is arranged on the base substrate 101, an orthographic projection of the light-emitting element 102 on the base substrate 101 at least partially overlaps with an orthographic projection of the opening 103 on the base substrate 101, and the light-emitting element 103 includes a first electrode 202 and a second electrode 203 which are symmetrically distributed relative to a second centerline R2 located between the first electrode 202 and the second electrode 203.

For example, as illustrated in FIG. 5B, the connecting portion 105 is arranged between the at least one pad 201 and the light-emitting element 102, and is configured to connect the at least one pad 201 with the light-emitting element 102.

For example, referring to FIG. 5A-FIG. 5E, the first pad 204 is arranged at a side of one of the first electrode 202 and the second electrode 203 close to the base substrate 101, and the second pad 208 is arranged at a side of the other one of the first electrode 202 and the second electrode 203 away from the base substrate 101, the first pad 204 includes a first size portion 205 and a second size portion 207, a minimum distance between the first size portion 205 and a first centerline R1 in the second direction Y is a sixth size C1, a minimum distance between the second size portion 207 and the first centerline R1 in the second direction Y is a seventh size C2; a maximum distance between the first electrode 201 and a second centerline R2 in the second direction Y is an eighth size Y1, wherein Y1=MAX(C1, C2).

Referring to FIG. 5A-FIG. 5E, the sixth size C1 between the first size portion 205 and the first centerline R1 in the second direction Y and the seventh size C2 between the second size portion 207 and the first centerline R1 in the second direction Y satisfy Y=MAX(C1, C2), a difference value between the sixth size C1 and the seventh size C2 is substantially the same as the size of the first electrode 202 or the second electrode 203 in the second direction Y. For example, an edge line of the first electrode 202 away from the second centerline R2 is basically arranged at one end of the first size portion 205 of the first pad 204 close to the first centerline R1. The first size portion 205 can provide a large arrangement region for the first electrode 202, so that a portion of the first electrode 202 in a direction of the second direction Y away from the second centerline R2 can be arranged on the flat region 160 of the connecting portion 105 as much as possible.

Therefore, the light-emitting substrate 01 provided by the embodiments of the present disclosure is beneficial to preventing the light-emitting element 102 from tilting or deviating, so that the light-emitting substrate 01 can achieve a good optical performance. At the same time, the pad in the embodiments of the present disclosure has an appropriate interval distance from the reflective layer around it, which can reduce the risk of "gold infiltration phenomenon".

The structural characteristics of the light-emitting substrate 01 may refer to relevant description in the aforementioned embodiments, which will not be repeated here.

Referring to FIG. 5A-FIG. 5E, the embodiments of the present disclosure provide a light-emitting substrate, including: a base substrate 101, a reflective layer 100, and at least one pad 201. The reflective layer 100 is arranged on the base substrate 101, the reflective layer 100 includes an opening 103, and a maximum size of the opening 103 in the first direction X is H1.

Referring to FIG. 5A-FIG. 5E, an orthographic projection of the at least one pad 201 on the base substrate 101 at least partially overlaps with an orthographic projection of the opening 103 on the base substrate 101, the at least one pad 201 includes a first pad 204 and a second pad 208 which are distributed at intervals in the second direction Y intersecting with the first direction X, and the first pad 204 includes a first size portion 205 and a second size portion 207; a minimum interval between the first size portion 205 and the opening 103 is K2, and a maximum interval between the second size portion 207 and the opening 103 is H2, which satisfies: $H2=H1/3\pm0.2$ μm, 50 μm$\leq H1-2K2-(H1-2H2)/(1\pm0.2)\leq$100 μm.

Referring to FIG. 5A-FIG. 5E, for example, an orthographic projection of the light-emitting element 102 arranged on a side of the pad 201 away from the base substrate 101 may be a narrow and long shape, for example, the orthographic projection of the light-emitting element 102 on the base substrate 101 is a rectangle. For example, as illustrated in FIG. 5D, the light-emitting element 102 includes a first electrode 202 and a second electrode 203, and a maximum size of the first electrode 202 in the first direction X is K1. For example, for the second size portion 201, $H1-H2=(1+0.2)K1$, and $H2\approx H1/3$; at this time, the first size portion 201 has a certain effect of restraining the light-emitting element 102 from a deviation. Compared with the second size portion 207, the first size portion 205 has a larger size in the first direction X, so that the connecting portion 105 arranged between the pad 201 and the light-emitting element 102 has a large flat region 160, thereby reducing the risk of tilt that the light-emitting element 201 may occur.

For example, the reflow soldering process may be adopted to achieve soldering the light-emitting element 102 with the pad 201, and an orthographic projection area of the opening 103 in the reflective layer 100 on the base substrate 101 is greater than an orthographic projection area of the pad 201 on the base substrate 101. For example, an orthographic projection region of the pad 201 on the base substrate 101 is completely surrounded by an orthographic projection region of the opening 103 in the reflective layer 100 on the base substrate 101. The pad 201 has a certain interval distance to the opening 103. For example, the pad 201 has a certain distance to the opening 103 in a direction other than the line-outlet direction. By setting $H2=H1/3\pm0.2$ μm, and 50 μm$\leq H1-2K2-(H1-2H2)/(1\pm0.2)\leq$100 μm, the pad 201 inside the opening can be arranged at an interval to the reflective layer 100, and the risk of "gold infiltration phenomenon" can be reduced within this interval distance. At the same time, an opening range of the opening 103 will not be made too large, and the reflective layer 100 can have an enough covering area to increase the reflectivity of the light-emitting substrate 01, thereby achieving a good optical performance of the light-emitting substrate 01.

The embodiments of the present disclosure further provide a display device, including the light-emitting substrate according to any of the above.

Figure 8:
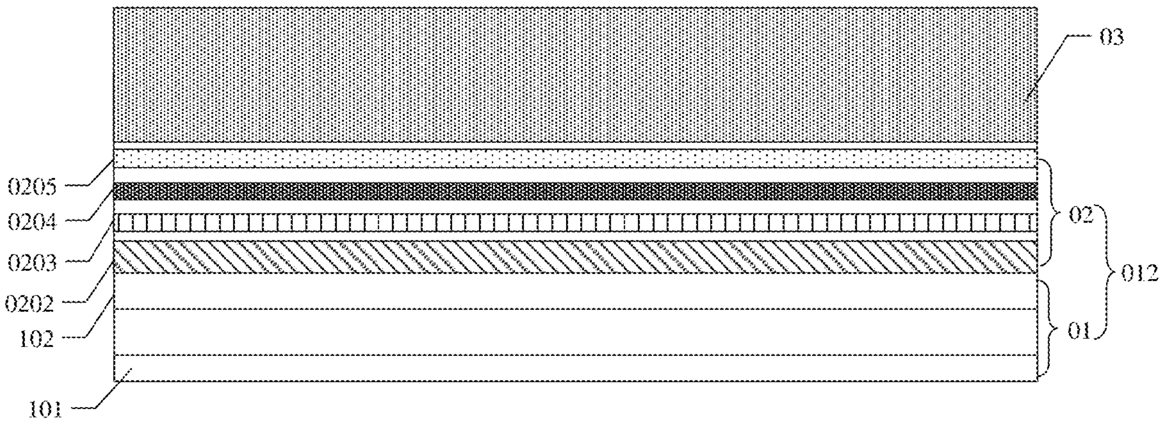
FIG. 8 is a schematic diagram of a display device provided by an embodiment of the present disclosure.

FIG. 8 is a schematic diagram of a display device provided by an embodiment of the present disclosure.

As illustrated in FIG. 8, the display device 1000 includes a light-emitting substrate 01, an optical layer 02 and a display panel 03; the optical layer 02 is arranged at a side of the light-emitting element 102 away from the base substrate 101; and the display panel 03 is arranged at a side of the optical layer 02 away from the light-emitting substrate 01.

For example, the optical layer 02 includes a diffusion layer 0202, a quantum dot film layer 0203, a diffusion layer 0204 and a composite film 0205 arranged sequentially in a vertical direction away from the base substrate 101. For example, the diffusion layer 0202 and the diffusion layer 0204 may improve a light shadow generated by the light-emitting substrate 01, and improve a display quality of the display device 1000. The quantum dot film layer 0203 can convert blue light into white light under an excitation of the blue light emitted by light-emitting substrate 01, which can improve a utilization rate of light energy of the light-emitting substrate 01. The composite film 0205 can improve a brightness of light propagated by the composite film 0205. For example, the optical layer 02 may further include other film layers, so as to improve an optical performance of the display device 1000.

For example, the light-emitting substrate 01 and the optical layer 02 may form at least a portion of a light-emitting module 012 in the display device 1000. The display panel 03 is arranged at one side of the light-emitting module 012, and is configured to protect each component in the display device 1000. For example, the display panel 03 may include a plurality of functional layers to better achieve the display effect.

In the display device 1000 provided by the above embodiments, the light-emitting element in the light-emitting substrate 01 is not easy to involve a circuit failure caused by the "gold infiltration phenomenon", and provides better reliability for the circuit; at the same time, the light-emitting element in the light-emitting substrate 01 has a small probability of optical path deviation, and the light-emitting substrate 01 achieves a good optical performance, thereby improving the display performance of the display device 1000.

For example, the display device 1000 described above may include a liquid crystal display (Liquid Crystal Display, referred to LCD) device. For example, the display device 1000 may be implemented in or associated with a plurality of electronic devices, the plurality of electronic devices include (but not limited to) mobile phone, wireless device, personal data assistant (PDA), handheld or portable computer, GPS receiver/navigator, camera, MP4 video player, video camera, game console, watch, clock, calculator, television monitor, flat panel display, computer monitor, car display (for example, odometer display, and the like), navigator, cockpit controller and/or displayer, displayer for camera view (for example, displayer for rearview camera in a vehicle), electronic photograph, electronic billboard or sign, projector, architectural structure, packaging and aesthetic structure (for example, display for image of a piece of jewelry), and the like.

In the present disclosure, the following points need to be explained:

(1) The drawings of the embodiments of the present disclosure only refer to the structures related to the disclosed embodiments, and other structures can refer to the general designs.

(2) Without conflict, the embodiments of the present disclosure and the features in the embodiments can be combined with each other to obtain new embodiment(s).

What have been described above are only specific implementations of the present disclosure, and the protection scope of the present disclosure should be determined based on the protection scope of the claims.

What is claimed is:

1. A light-emitting substrate, comprising:

a base substrate;

a reflective layer arranged on the base substrate, wherein the reflective layer comprises an opening, and a maximum size of the opening in a first direction is H1;

at least one pad, wherein an orthographic projection of the at least one pad on the base substrate at least partially overlaps with an orthographic projection of the opening on the base substrate;

a light-emitting element arranged on the base substrate, wherein an orthographic projection of the light-emitting element on the base substrate at least partially overlaps with the orthographic projection of the opening on the base substrate, and the light-emitting element comprises a first electrode and a second electrode; and a connecting portion arranged between the at least one pad and the light-emitting element and configured to connect the at least one pad and the light-emitting element, wherein the connecting portion comprises an edge radian region, and a maximum size of the edge radian region in the first direction is M; wherein the first electrode and the second electrode are arranged at intervals in a second direction, the second direction intersects with the first direction, and a maximum size of the first electrode or the second electrode in the first direction is a first size K1; and the at least one pad comprises a first pad, the first pad comprises a first size portion, a minimum distance between the first size portion and the opening in the first direction is a second size K2, and the second size K2 satisfies: $K2 \leq 0.5H1-0.5\ (K1+2M)$, and $50\ \mu m \leq H1-2K2-K1 \leq 100\ \mu m$.

2. A display device, comprising the light-emitting substrate according to claim 1.

3. The light-emitting substrate according to claim 1, wherein the first pad further comprises a second size portion, a maximum distance between the second size portion and the opening in the first direction is a third size H2, and the third size H2 satisfies: $0.5H1-0.6K1 \leq H2 \leq 0.5H1-0.4K1$.

4. The light-emitting substrate according to claim 3, wherein the at least one pad further comprises a second pad, the first pad and the second pad are distributed at intervals and are symmetrical relative to a first centerline located between the first pad and the second pad;

the first electrode and the second electrode are symmetrically distributed relative to a second centerline located between the first electrode and the second electrode of the light-emitting element;

wherein the at least one pad is arranged at a side of the first electrode and the second electrode close to the base substrate;

a minimum distance between the first electrode and the second electrode in the second direction is a fourth size Z; and a minimum distance between the first pad and the second pad in the second direction is a fifth size D, wherein $0.9Z \leq D \leq Z$.

5. The light-emitting substrate according to claim 4, wherein a minimum distance between the first size portion and the first centerline in the second direction is a sixth size C1, and a minimum distance between the second size portion and the first centerline in the second direction is a seventh size C2; and a maximum distance between the first electrode and the second centerline in the second direction is an eighth size Y, wherein $Y=MAX\ (C1, C2)$.

6. The light-emitting substrate according to claim 4, wherein in the first direction, a maximum size of the first size portion is equal to the maximum size of the opening;

the first size portion and the second size portion each comprise a first end and a second end opposite to each other, and the first end of the first size portion and the first end of the second size portion are arranged at a side close to the first centerline; and a minimum distance between the second end of the first size portion and the opening in the second direction is substantially equal to a size of the first size portion in the second direction.

7. The light-emitting substrate according to claim 6, wherein a size of the first size portion in the first direction is greater than a size of the first size portion in the second direction; and a size of the second size portion in the second direction gradually increases from the first end of the second size portion to the second end of the second size portion;

and/or, an orthographic projection of the first size portion on the base substrate is a rectangle, and an orthographic projection of the second size portion on the base substrate is a trapezoid.

8. The light-emitting substrate according to claim 4, wherein in the second direction, a maximum distance between an edge of the first pad away from the second pad and an edge of the second pad away from the first pad is equal to a maximum size of the opening; and the first size portion and the second size portion each comprise a first end and a second end opposite to each other, wherein the first end of the first size portion is closer to the first centerline than the second end of the first size portion, and the first end of the second size portion is closer to the first centerline than the second end of the second size portion.

9. The light-emitting substrate according to claim 8, wherein in the first direction, a minimum distance between the first end of the first size portion and the opening is the second size K2, a maximum distance between the first end of the second size portion and the opening is the third size H2, and the second end of the first size portion is connected with the first end of the second size portion;

the first pad further comprises a third size portion and a fourth size portion, the third size portion and the fourth size portion each comprise a first end and a second end opposite to each other; the first end of the third size portion is connected with the second end of the second size portion in the second direction, an orthographic projection of the second end of the third size portion on the base substrate overlaps with the orthographic projection of the opening on the base substrate, and the second end of the fourth size portion is connected with the first end of the first size portion;

a size of the third size portion in the first direction gradually decreases from the first end of the third size portion to the second end of the third size portion; and a size of the fourth size portion in the first direction gradually decreases from the first end of the fourth size portion to the second end of the fourth size portion, and a size of the second end of the fourth size portion in the first direction is equal to a size of the first end of the first size portion in the first direction.

10. The light-emitting substrate according to claim 9, wherein an orthographic projection of each of the first size portion, the second size portion, the third size portion, and the fourth size portion on the base substrate is a trapezoid.

11. The light-emitting substrate according to claim 8, wherein the first end of the first size portion is connected with the second end of the second size portion; and in the first direction, a maximum distance between the first end of the second size portion and the opening is the third size H2.

12. The light-emitting substrate according to claim 11, wherein an orthographic projection of the first size portion on the base substrate is a rectangle, a size of the first size portion in the first direction is greater than a size of the first size portion in the second direction, and an orthographic projection of the second end of the first size portion on the base substrate overlaps with the orthographic projection of the opening on the base substrate; and an orthographic projection of the second size portion on the base substrate is a trapezoid, and the second size portion comprises an upper bottom and a lower bottom parallel to the first centerline, a distance between the upper bottom and the opening in the first direction is greater than a distance between the lower bottom and the opening in the first direction.

13. The light-emitting substrate according to claim 11, wherein an orthographic projection of the first size portion on the base substrate is a rectangle, and a size of the first size portion in the first direction is greater than a size of the first size portion in the second direction;

an orthographic projection of the second size portion on the base substrate is a rectangle, and a size of the second size portion in the first direction is greater than a size of the second size portion in the second direction; and the first pad further comprises a third size portion, the third size portion comprises a first end and a second end opposite to each other, and the first end of the third size portion is connected with the second end of the first size portion in the second direction, an orthographic projection of the second end of the third size portion on the base substrate overlaps with the orthographic projection of the opening on the base substrate, and a size of the third size portion in the second direction is smaller than the size of the first size portion in the second direction.

14. The light-emitting substrate according to claim 13, wherein the size of the second size portion in the first direction gradually increases from the first end of the second size portion to the second end of the second size portion, and a size of the second end of the second size portion in the first direction is equal to a size of the first end of the first size portion in the first direction.

15. The light-emitting substrate according to claim 8, wherein in the first direction, a minimum distance between the first end of the first size portion and the opening is the second size K2, a maximum distance between the first end of the second size portion and the opening is the third size H2, and an orthographic projection of the second end of the second size portion on the base substrate overlaps with the orthographic projection of the opening on the base substrate.

16. The light-emitting substrate according to claim 15, wherein an orthographic projection of the first size portion on the base substrate is a rectangle, and a size of the first size portion in the first direction is greater than a size of the first size portion in the second direction; and an orthographic projection of the second size portion on the base substrate is a rectangle, and a size of the second size portion in the first direction is smaller than the size of the first size portion in the second direction; the first size portion is connected with the second size portion.

17. The light-emitting substrate according to claim 16, wherein the first pad further comprises a third size portion, the third size portion comprises a first end and a second end opposite to each other, and in the second direction, the first end of the third size portion is connected with the second end of the first size portion, and the second end of the third size portion is connected with the first end of the second size portion; and a size of the third size portion in the first direction gradually decreases from the first end of the third size portion to the second end of the third size portion, a size of the first end of the third size portion in the first direction is equal to a size of the second end of the first size portion in the first direction, and a size of the second end of the third size portion in the first direction is equal to a size of the first end of the second size portion in the first direction.

18. The light-emitting substrate according to claim 15, wherein in the first direction, a size of the second end of the first size portion is equal to a size of the first end of the second size portion, and the second end of the first size portion is connected with the first end of the second size portion;

a size of the first size portion in the first direction gradually decreases from the first end of the first size portion to the second end of the second size portion;

the first pad further comprises a third size portion, the third size portion comprises a first end and a second end opposite to each other, and the second end of the third size portion is in matched connection with the first end of the first size portion in the second direction; and a size of the third size portion in the first direction gradually decreases from the first end of the third size portion to the second end of the third size portion.

19. The light-emitting substrate according to claim 18, wherein an orthographic projection of the first size portion on the base substrate is a trapezoid, and an orthographic projection of the third size portion on the base substrate is a trapezoid, and/or, a connecting side portion between the second end of the first size portion and the first end of the second size portion is arc-shaped; and the first end of the third size portion is arc-shaped.

20. A light-emitting substrate, comprising:

a base substrate;

a reflective layer arranged on the base substrate, wherein the reflective layer comprises an opening, and a maximum size of the opening in a first direction is H1;

at least one pad, wherein an orthographic projection of the at least one pad on the base substrate at least partially overlaps with an orthographic projection of the opening on the base substrate, the at least one pad comprises a first pad and a second pad, the first pad and the second pad are distributed at intervals in a second direction, the second direction intersects with the first direction, and the first pad comprises a first size portion and a second size portion, wherein a minimum interval between the first size portion and the opening is K2, and a maximum interval between the second size portion and the opening is H2, which satisfies:

$$H2=H1/3+0.2\ \mu m,\ 50\ \mu m \le H1-2K2-(H1-2H2)/(1+0.2) \le 100\ \mu m.$$

* * * * *